(12) United States Patent
Lai et al.

(10) Patent No.: US 12,300,540 B2
(45) Date of Patent: May 13, 2025

(54) CONDUCTIVE FEATURE OF SEMICONDUCTOR DEVICE AND METHOD OF FORMING SAME

(71) Applicant: Taiwan Semiconductor Manufacturing Co., Ltd., Hsinchu (TW)

(72) Inventors: Bo-Yu Lai, Taipei (TW); Chin-Szu Lee, Taoyuan (TW); Szu-Hua Wu, Zhubei (TW); Shuen-Shin Liang, Hsinchu (TW); Chia-Hung Chu, Taipei (TW); Keng-Chu Lin, Ping-Tung (TW); Sung-Li Wang, Zhubei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 229 days.

(21) Appl. No.: 17/401,633

(22) Filed: Aug. 13, 2021

(65) Prior Publication Data

US 2022/0277994 A1 Sep. 1, 2022

Related U.S. Application Data

(60) Provisional application No. 63/154,019, filed on Feb. 26, 2021.

(51) Int. Cl.
*H01L 21/768* (2006.01)
*H01L 23/522* (2006.01)
(Continued)

(52) U.S. Cl.
CPC .. *H01L 21/76867* (2013.01); *H01L 21/76847* (2013.01); *H01L 21/76883* (2013.01);
(Continued)

(58) Field of Classification Search
CPC ......... H01L 21/76867; H01L 21/76847; H01L 21/76883; H01L 23/53266; H01L 29/401; H01L 29/66795; H01L 23/5226; H01L 29/41791; H01L 29/45; H01L 29/456; H01L 21/76877; H01L 21/76895; H01L 21/76897; H01L 23/485; H01L 23/53209;
(Continued)

(56) References Cited

U.S. PATENT DOCUMENTS 9,105,490 B2 8/2015 Wang et al.
9,236,267 B2 1/2016 De et al.
(Continued)

*Primary Examiner* — Mohammad A Rahman
(74) *Attorney, Agent, or Firm* — Slater Matsil, LLP

(57) ABSTRACT

A method includes forming a device region over a substrate; forming a first dielectric layer over the device region; forming an opening in the first dielectric layer; conformally depositing a first conductive material along sidewalls and bottom surfaces of the opening; depositing a second conductive material on the first conductive material to fill the opening, wherein the second conductive material is different from the first conductive material; and performing a first thermal process to form an interface region extending from a first region of the first conductive material to a second region of the second conductive material, wherein the interface region includes a homogeneous mixture of the first conductive material and the second conductive material.

20 Claims, 32 Drawing Sheets

(51) Int. Cl.
 *H01L 23/532* (2006.01)
 *H01L 29/40* (2006.01)
 *H01L 29/417* (2006.01)
 *H01L 29/45* (2006.01)
 *H01L 29/66* (2006.01)

(52) U.S. Cl.
 CPC ...... *H01L 23/53266* (2013.01); *H01L 29/401* (2013.01); *H01L 29/66795* (2013.01); *H01L 23/5226* (2013.01); *H01L 29/41791* (2013.01); *H01L 29/45* (2013.01); *H01L 29/456* (2013.01)

(58) Field of Classification Search
 CPC ............. H01L 23/53252; H01L 29/165; H01L 29/66545; H01L 29/66439; H01L 29/775; H01L 29/7848; H01L 21/823814; H01L 21/823821; H01L 21/823871; H01L 27/0924; H01L 21/823828; H01L 29/785
 See application file for complete search history.

(56) References Cited

U.S. PATENT DOCUMENTS

| | | | |
|---|---|---|---|
| 9,236,300 B2 | 1/2016 | Liaw | |
| 9,406,804 B2 | 8/2016 | Huang et al. | |
| 9,443,769 B2 | 9/2016 | Wang et al. | |
| 9,520,482 B1 | 12/2016 | Chang et al. | |
| 9,548,366 B1 | 1/2017 | Ho et al. | |
| 9,576,814 B2 | 2/2017 | Wu et al. | |
| 9,831,183 B2 | 11/2017 | Lin et al. | |
| 9,859,386 B2 | 1/2018 | Ho et al. | |
| 11,011,413 B2 | 5/2021 | Wang et al. | |
| 11,521,929 B2 | 12/2022 | Liang et al. | |
| 11,594,609 B2 | 2/2023 | Liang et al. | |
| 11,894,437 B2 | 2/2024 | Liang et al. | |
| 11,929,327 B2 | 3/2024 | Chang et al. | |
| 2012/0235106 A1* | 9/2012 | Tang | H01L 21/7684 257/E21.645 |
| 2018/0096888 A1* | 4/2018 | Naik | H01L 23/53233 |
| 2018/0151424 A1* | 5/2018 | Yao | H01L 21/76856 |
| 2020/0006063 A1* | 1/2020 | Chen | H01L 21/02373 |

* cited by examiner

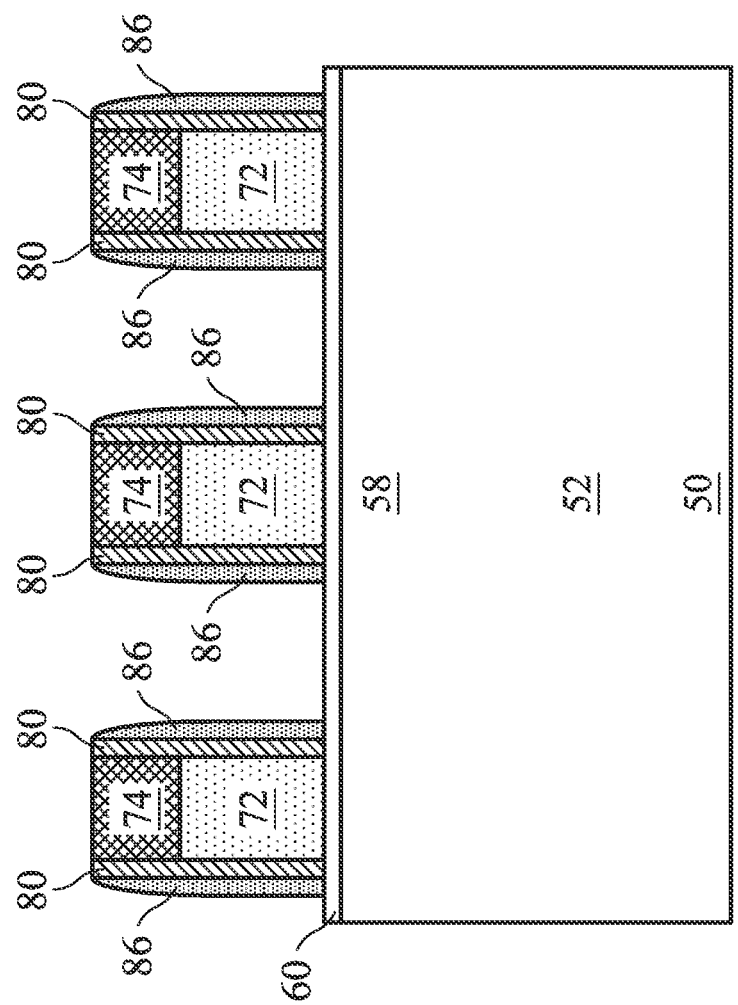
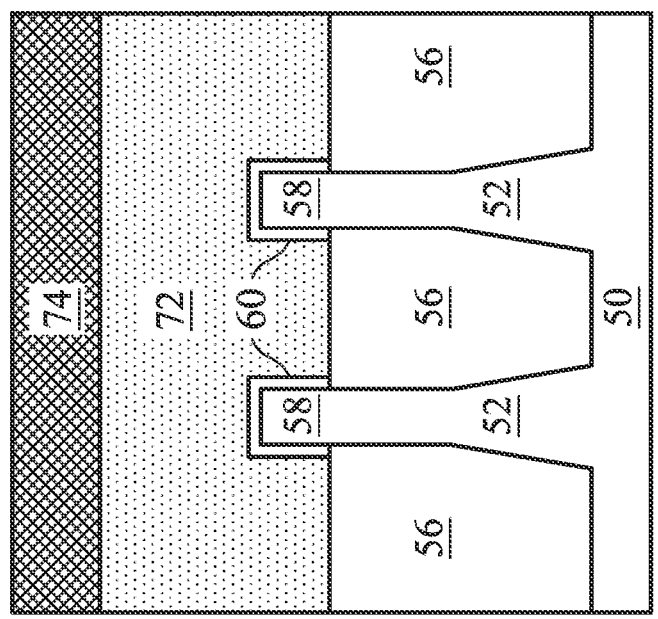
Figure 9A
Figure 9B

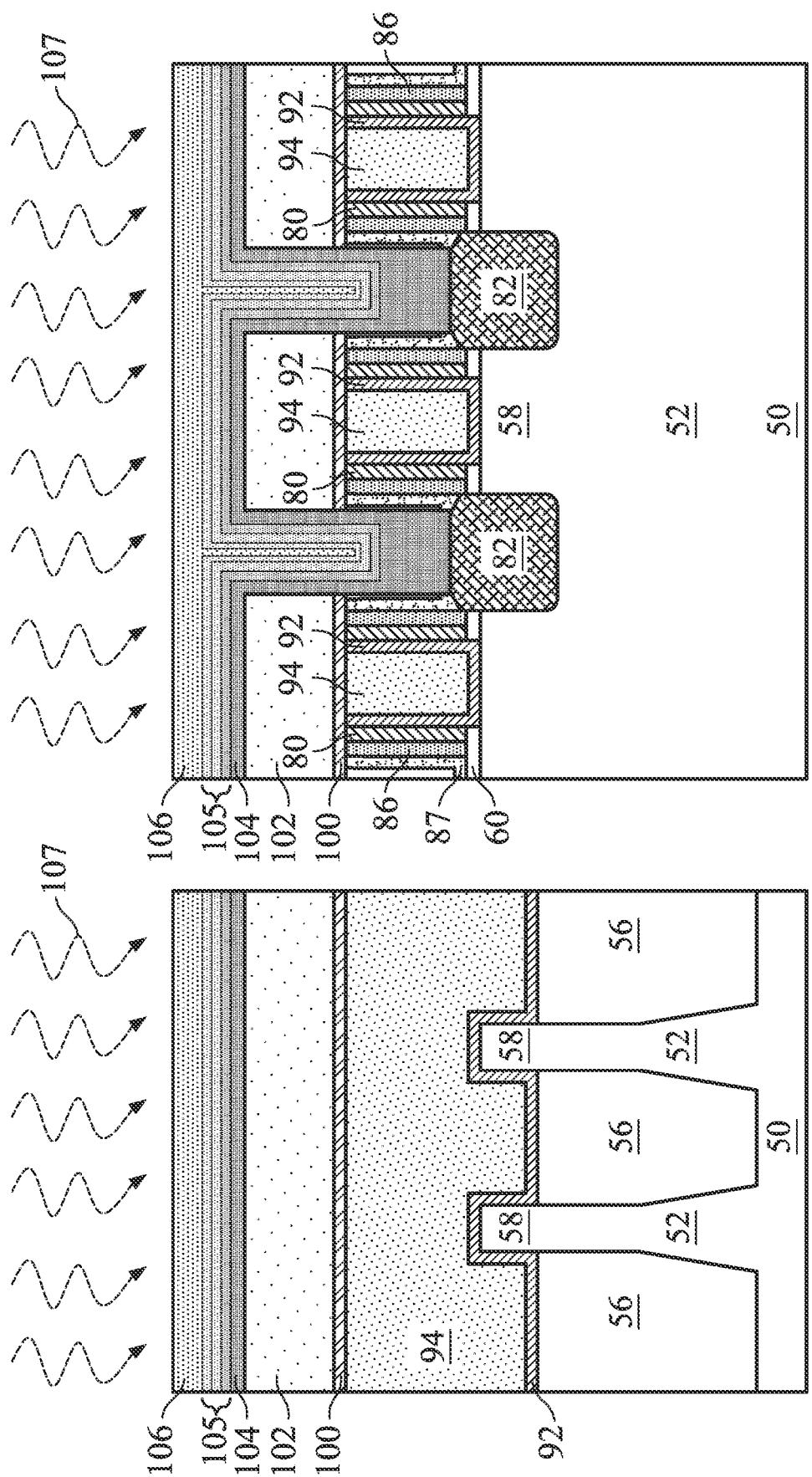

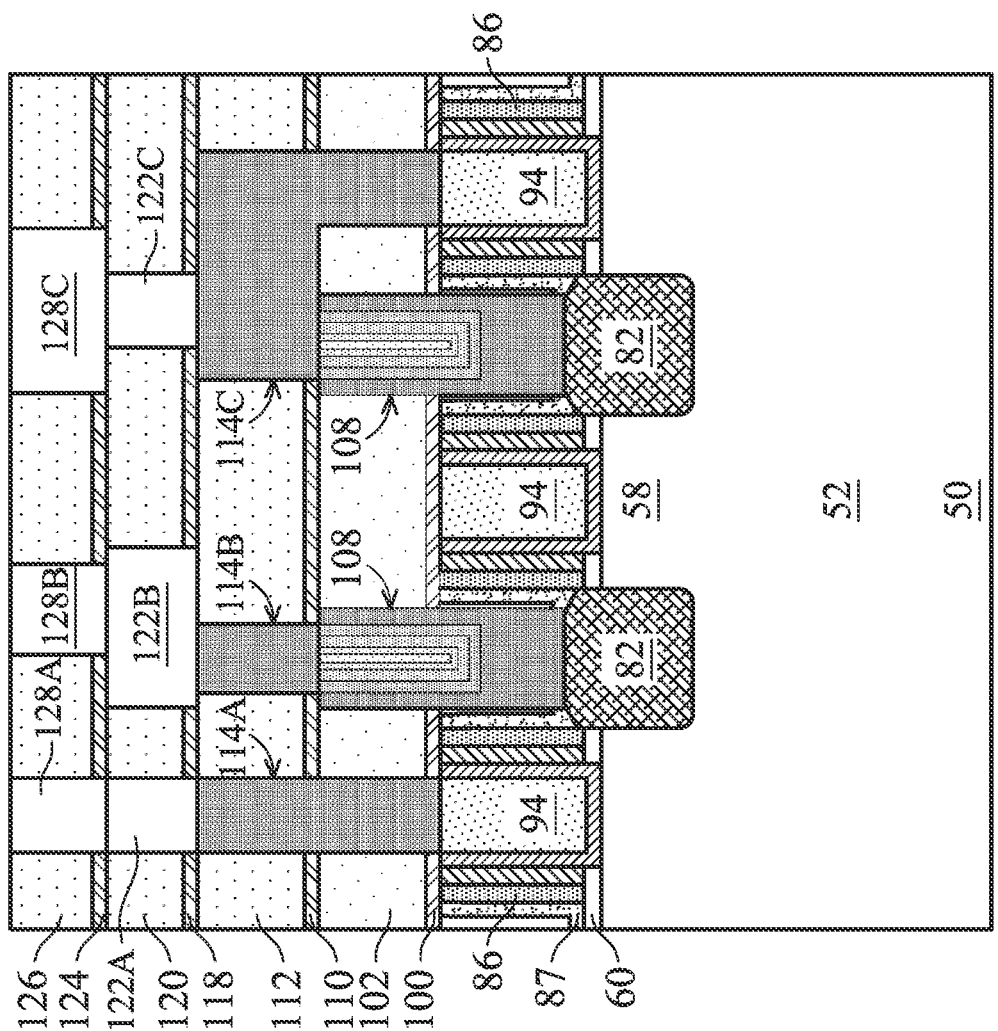
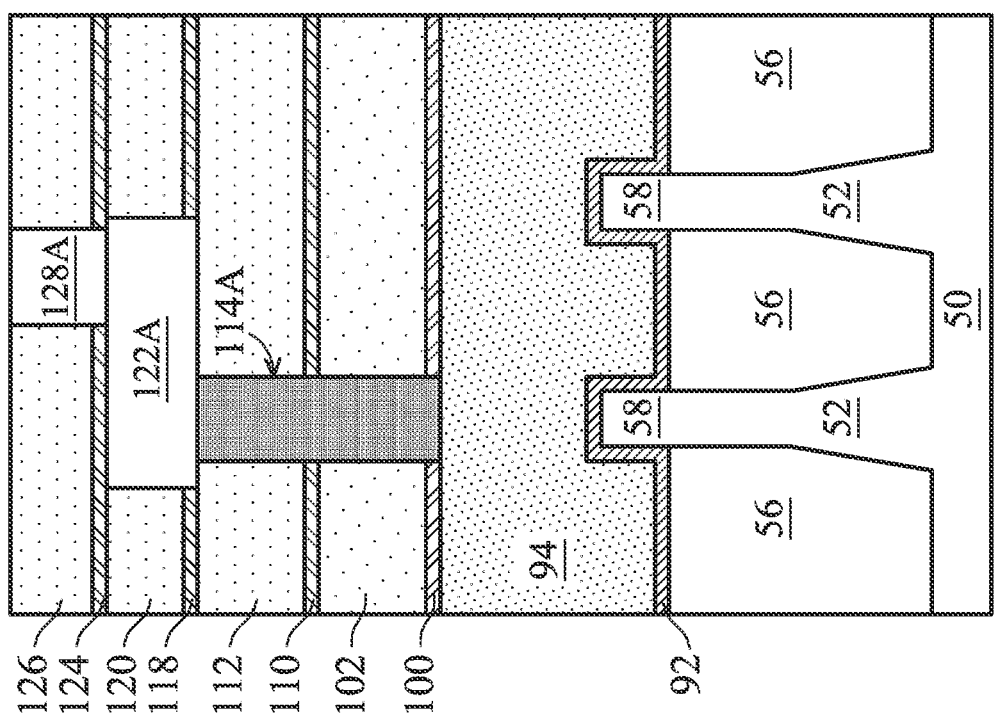
Figure 25B
Figure 25A

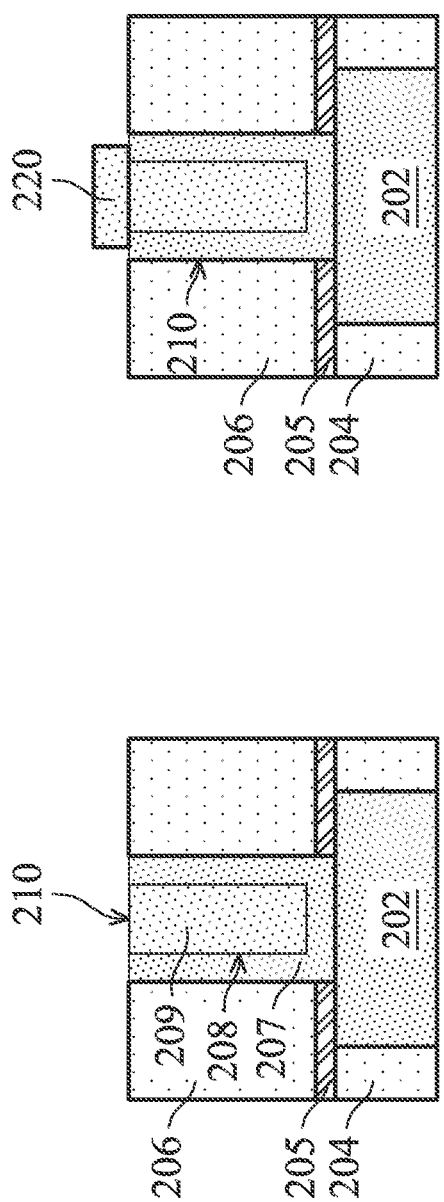
Figure 28A
Figure 28B
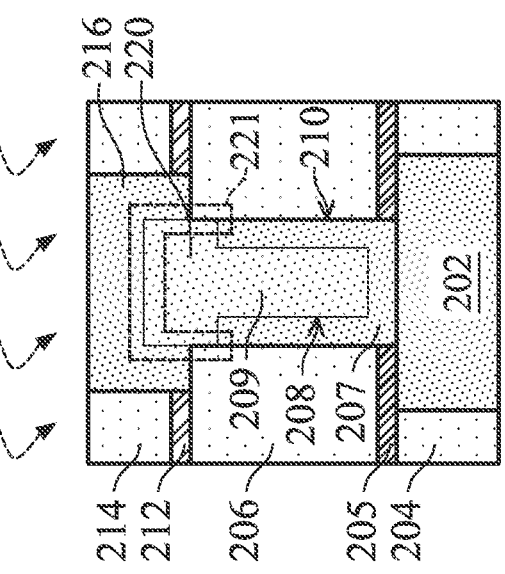
Figure 28D
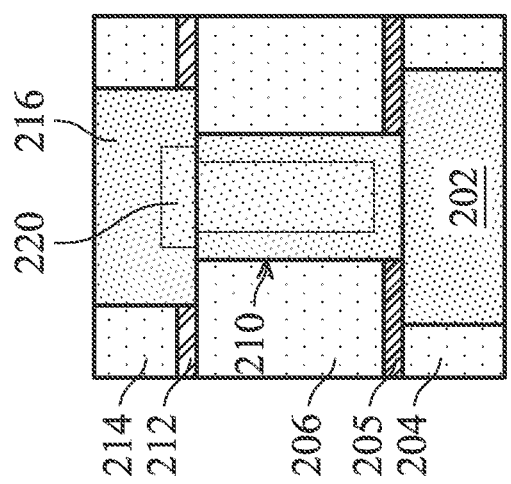
Figure 28C

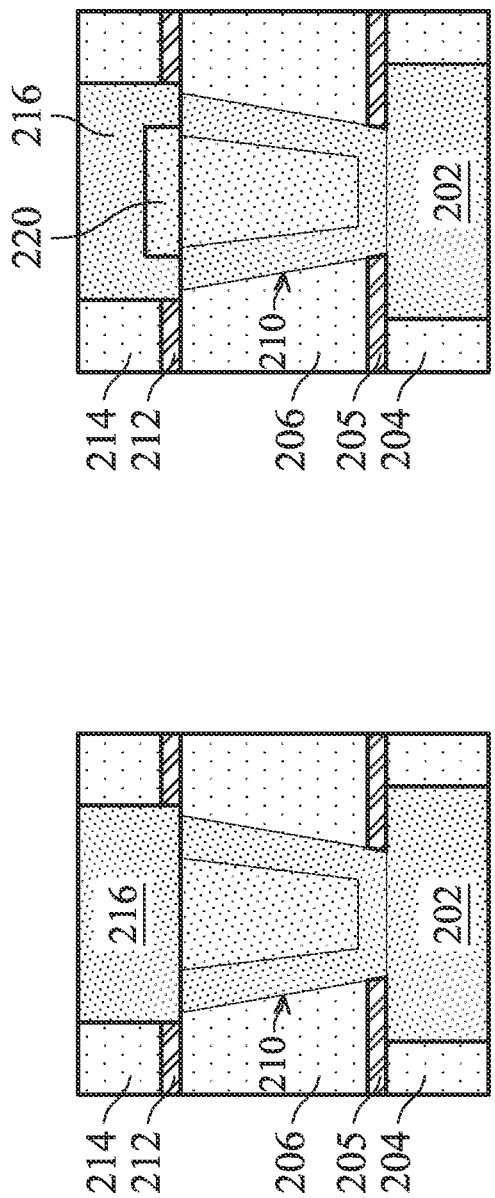
Figure 29A
Figure 29B
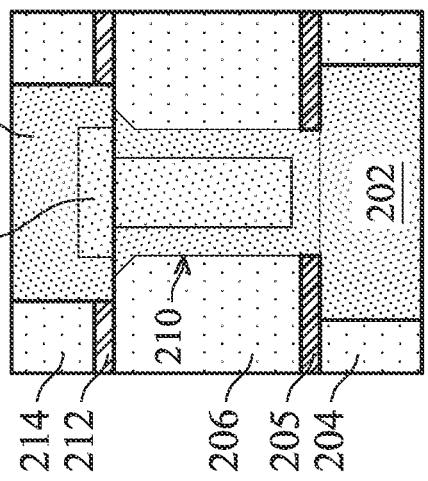
Figure 29C
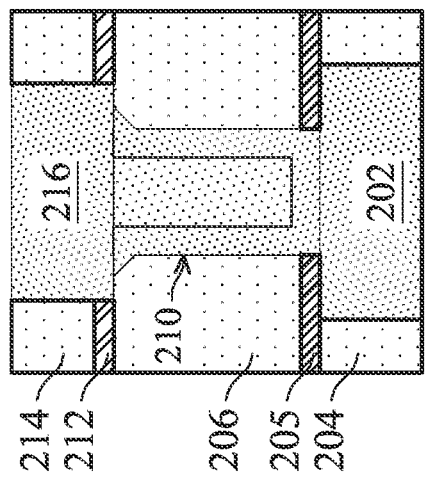
Figure 29D

CONDUCTIVE FEATURE OF SEMICONDUCTOR DEVICE AND METHOD OF FORMING SAME

PRIORITY CLAIM AND CROSS-REFERENCE

This application claims the benefit of U.S. Provisional Application No. 63/154,019, filed on Feb. 26, 2021, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6, 7, 8A, 8B, 9A, 9B, 10A, 10B, 10C, 10D, 11A, 11B, 12A, 12B, 13A, 13B, 14A, 14B, 14C, 15A, 15B, 16A, 16B, 17A, 17B, 18A, 18B, 19A, 19B, 20A, 20B, 21A, 21B, 22A, 22B, 23A, 23B, 24A, 24B, 25A, and 25B are cross-sectional views of intermediate stages in the manufacturing of FinFETs, in accordance with some embodiments.

FIGS. 28A, 28B, 28C, and 28D are cross-sectional views of intermediate stages in the manufacturing of conductive features with a capping layer, in accordance with some embodiments.

FIGS. 29A, 29B, 29C, and 29D are cross-sectional views of conductive features, in accordance with some embodiments.

DETAILED DESCRIPTION

Figure 1:
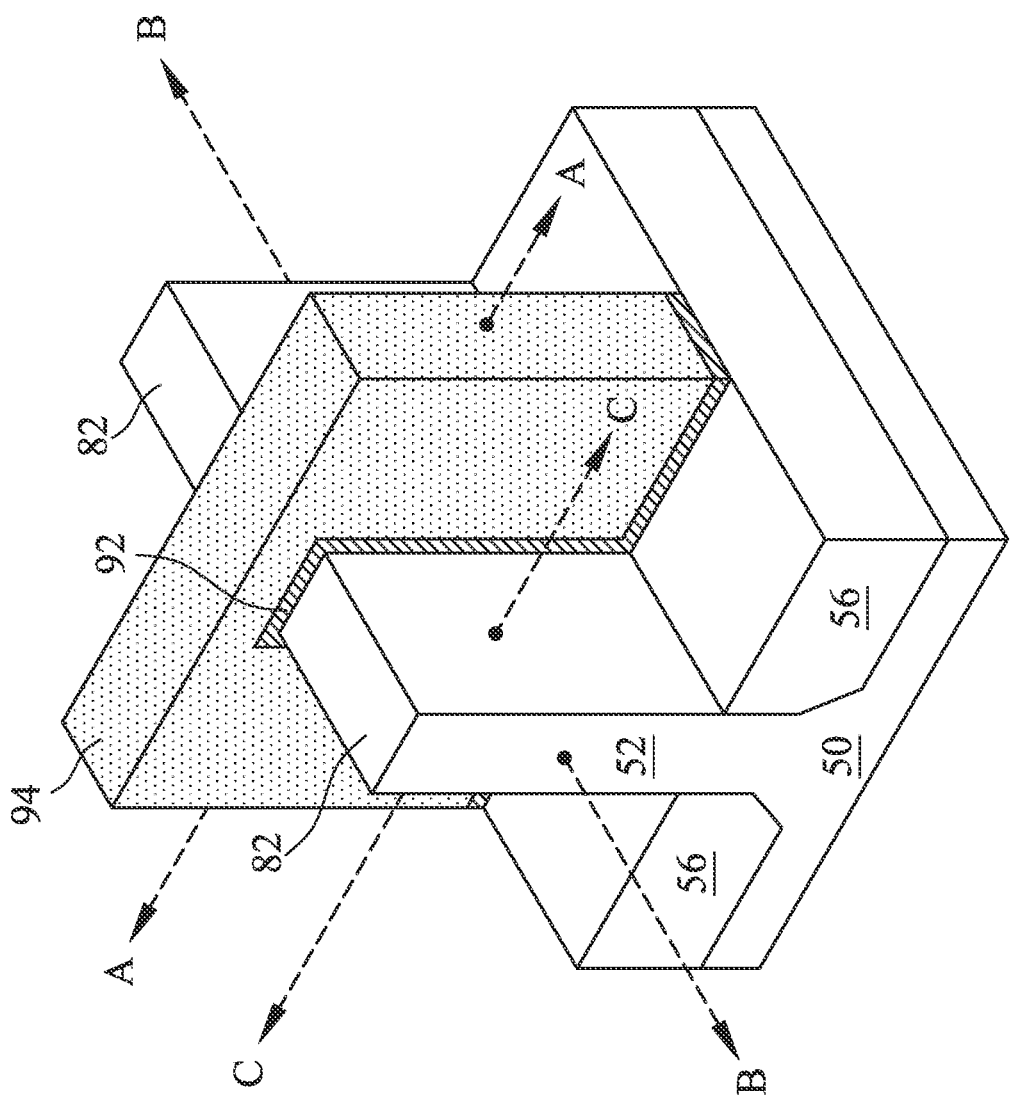
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments described herein allow for the formation of low-resistance conductive features such as vias, lines, or the like. Embodiments described herein allow for conductive features to be formed using a liner layer comprising a first conductive material and a filler layer comprising a second conductive material that is able to form a homogeneous mixture with the first conductive material. A thermal process such as an anneal may be performed to form a smoother interface between the liner layer and the filler layer, which can reduce resistance of the conductive features. Forming conductive features in this manner can reduce bending due to seam merging or thermal expansion, which can improve yield and reliability. A capping layer may be formed to increase the contact area of the conductive features, which can reduce contact resistance. The techniques described herein may form conductive features as part of a middle-end-of-line (MEOL) process and/or a back-end-of-line (BEOL) process.

FIG. 1 illustrates an example of a FinFET in a three-dimensional view, in accordance with some embodiments. The FinFET comprises a fin 52 on a substrate 50 (e.g., a semiconductor substrate). Isolation regions 56 are disposed in the substrate 50, and the fin 52 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring isolation regions 56.

A gate dielectric layer 92 is along sidewalls and over a top surface of the fin 52, and a gate electrode 94 is over the gate dielectric layer 92. Source/drain regions 82 are disposed in opposite sides of the fin 52 with respect to the gate dielectric layer 92 and gate electrode 94. FIG. 1 further illustrates reference cross-sections that are used in later figures. Cross-section A-A is along a longitudinal axis of the gate electrode 94 and in a direction, for example, perpendicular to the direction of current flow between the source/drain regions 82 of the FinFET. Cross-section B-B is perpendicular to cross-section A-A and is along a longitudinal axis of the fin 52 and in a direction of, for example, a current flow between the source/drain regions 82 of the FinFET. Cross-section C-C is parallel to cross-section A-A and extends through a source/drain region of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs, nanostructure (e.g., nanosheet, nanowire, gate-all-around, or the like) field effect transistors (NSFETs), or the like.

FIGS. 2 through 25B are cross-sectional views of intermediate stages in the manufacturing of FinFETs, in accordance with some embodiments. FIGS. 2 through 7 illustrate reference cross-section A-A illustrated in FIG. 1, except for multiple fins/FinFETs. FIGS. 8A, 9A, 10A, 11A, 12A, 13A, 14A, 15A, 16A, 17A, 18A, 19A, 20A, 21A, 22A, 23A, 24A, and 25A are illustrated along reference cross-section A-A illustrated in FIG. 1, and FIGS. 8B, 9B, 10B, 11B, 12B, 13B, 14B, 14C, 15B, 16B, 17B, 18B, 19B, 20B, 21B, 22B, 23B, 24B, and 25B are illustrated along a similar cross-section B-B illustrated in FIG. 1, except for multiple fins/FinFETs. FIGS. 10C and 10D are illustrated along reference cross-section C-C illustrated in FIG. 1, except for multiple fins/FinFETs.

Figure 2:
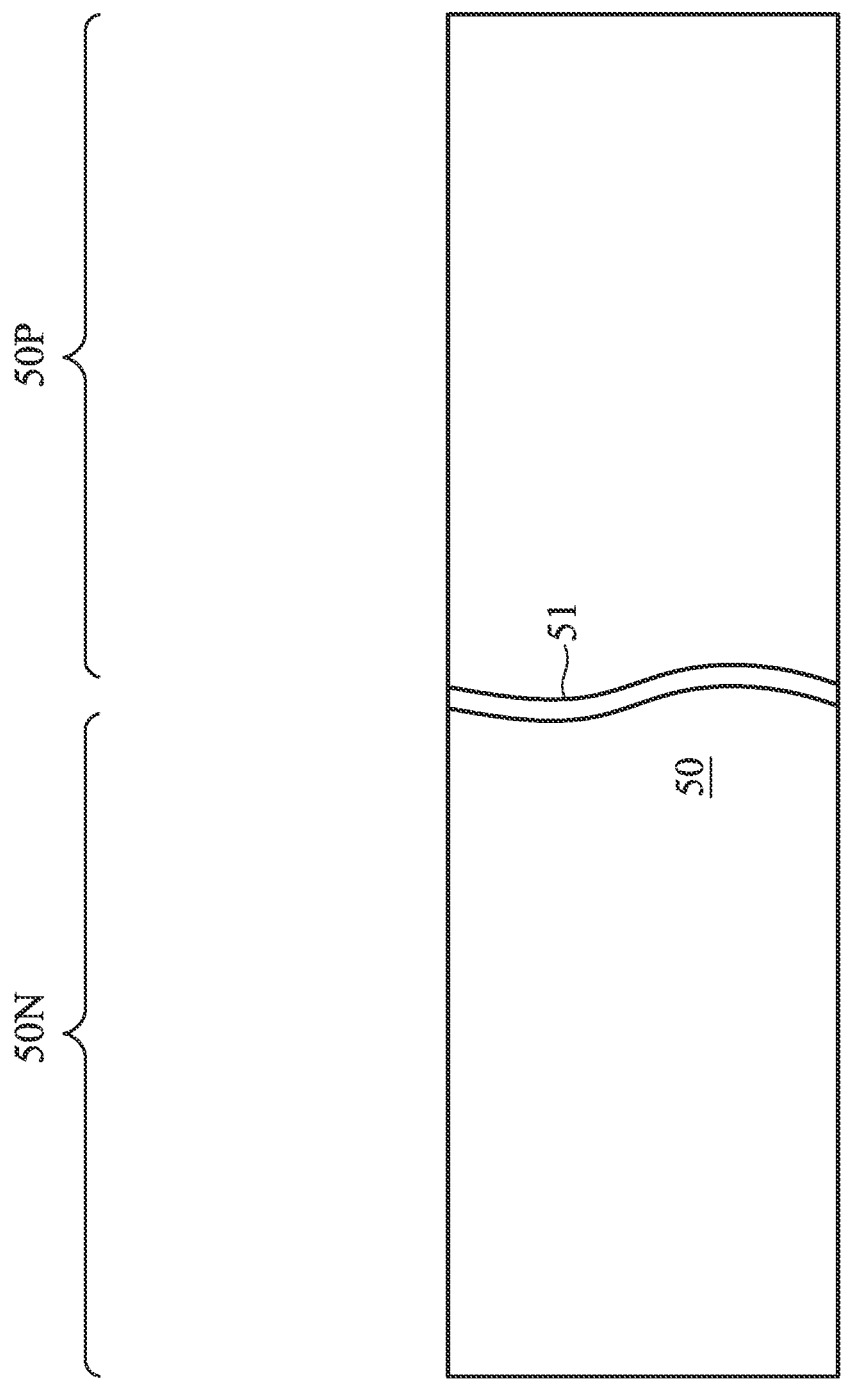

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type FinFETs. The p-type region 50P can be for forming p-type devices, such as PMOS transistors, e.g., p-type FinFETs. The n-type region 50N may be physically separated from the p-type region 50P (as illustrated by divider 51), and any number of device features (e.g., other active devices, doped regions, isolation structures, etc.) may be disposed between the n-type region 50N and the p-type region 50P.

Figure 3:
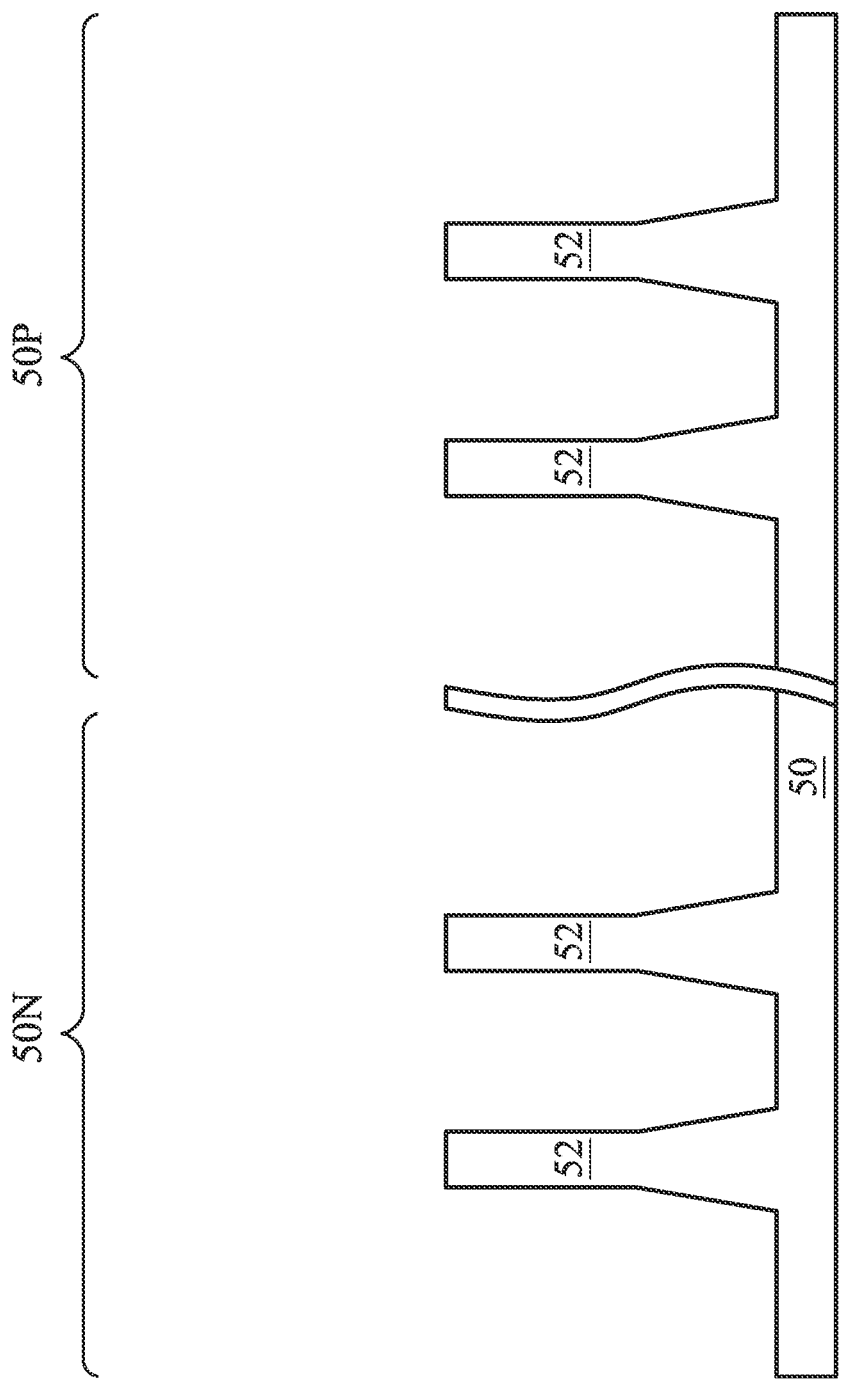

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

The fins may be patterned by any suitable method. For example, the fins 52 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. In some embodiments, the mask (or other layer) may remain on the fins 52.

Figure 4:
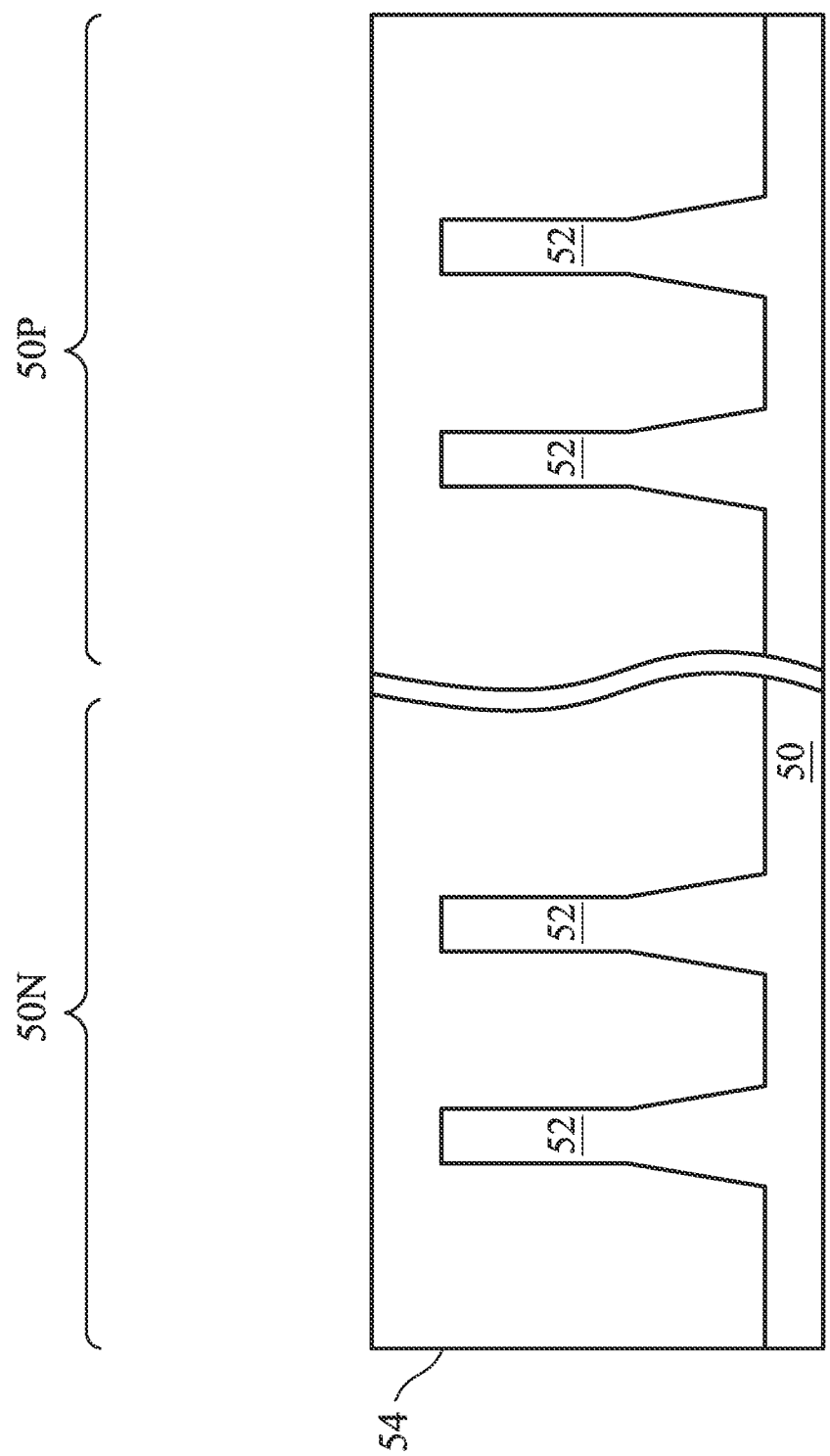

In FIG. 4, an insulation material 54 is formed over the substrate 50 and between neighboring fins 52. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 52. Although the insulation material 54 is illustrated as a single layer, some embodiments may utilize multiple layers. For example, in some embodiments a liner (not shown) may first be formed along a surface of the substrate 50 and the fins 52. Thereafter, a fill material, such as those discussed above may be formed over the liner.

Figure 5:
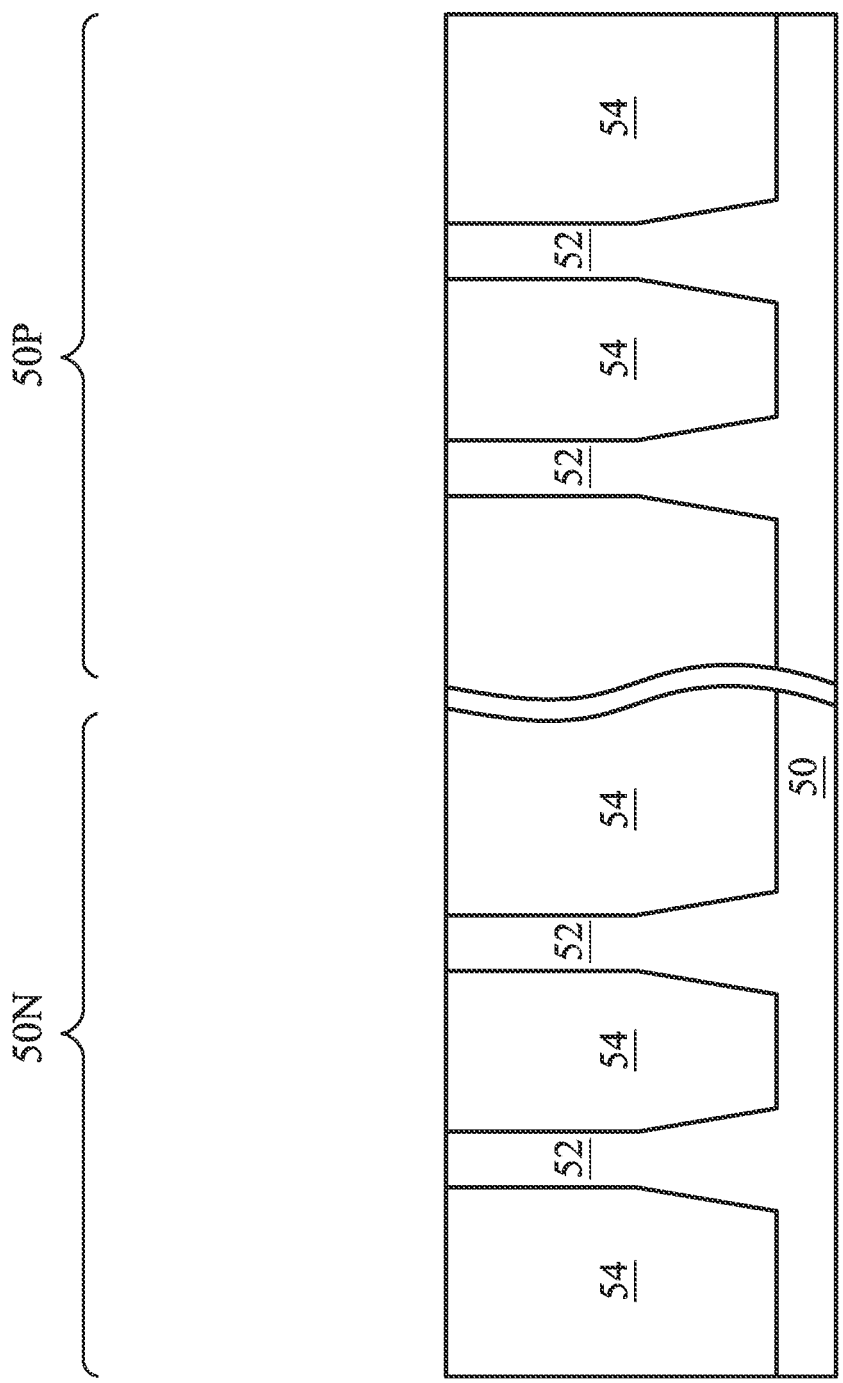

In FIG. 5, a removal process is applied to the insulation material 54 to remove excess insulation material 54 over the fins 52. In some embodiments, a planarization process such as a chemical mechanical polish (CMP), an etch-back process, combinations thereof, or the like may be utilized. The planarization process exposes the fins 52 such that top surfaces of the fins 52 and the insulation material 54 are level after the planarization process is complete. In embodiments in which a mask remains on the fins 52, the planarization process may expose the mask or remove the mask such that top surfaces of the mask or the fins 52, respectively, and the insulation material 54 are level after the planarization process is complete.

Figure 6:
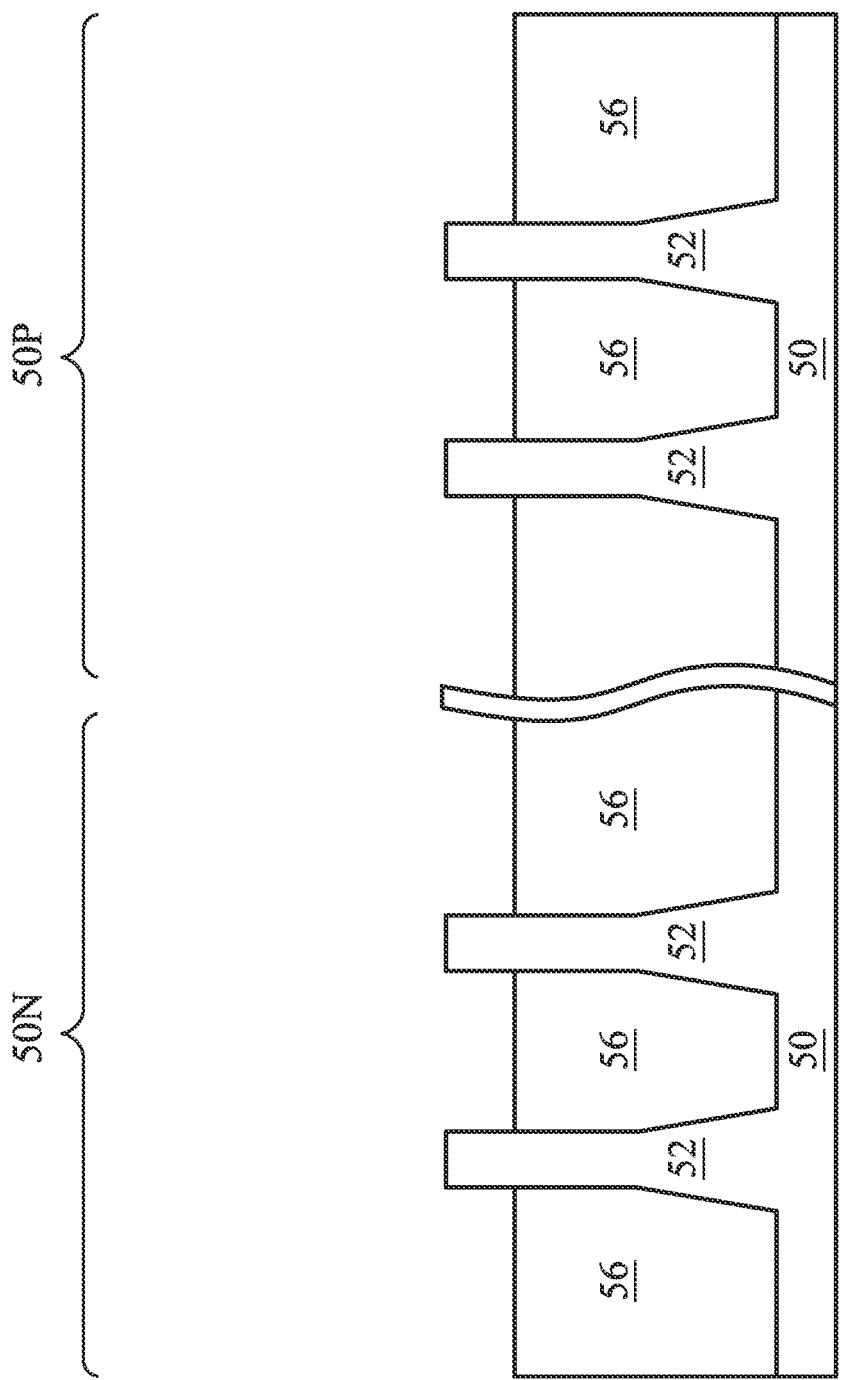

In FIG. 6, the insulation material 54 is recessed to form Shallow Trench Isolation (STI) regions 56. The insulation material 54 is recessed such that upper portions of fins 52 in the n-type region 50N and in the p-type region 50P protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54 (e.g., etches the material of the insulation material 54 at a faster rate than the material of the fins 52). For example, an oxide removal using, for example, dilute hydrofluoric (dHF) acid may be used.

The process described with respect to FIGS. 2 through 6 is just one example of how the fins 52 may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 52. For example, the fins 52 in FIG. 5 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in n-type region 50N (e.g., an NMOS region) different from the material in p-type region 50P (e.g., a PMOS region). In various embodiments, upper portions of the fins 52 may be formed from silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further in FIG. 6, appropriate wells (not shown) may be formed in the fins 52 and/or the substrate 50. In some embodiments, a P well may be formed in the n-type region 50N, and an N well may be formed in the p-type region 50P. In some embodiments, a P well or an N well are formed in both the n-type region 50N and the p-type region 50P.

In the embodiments with different well types, the different implant steps for the n-type region 50N and the p-type region 50P may be achieved using a photoresist and/or other masks (not shown). For example, a photoresist may be formed over the fins 52 and the STI regions 56 in the n-type region 50N. The photoresist is patterned to expose the p-type region 50P of the substrate 50. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist is removed, such as by an acceptable ashing process.

Following the implanting of the p-type region 50P, a photoresist is formed over the fins 52 and the STI regions 56 in the p-type region 50P. The photoresist is patterned to expose the n-type region 50N of the substrate 50. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 7:
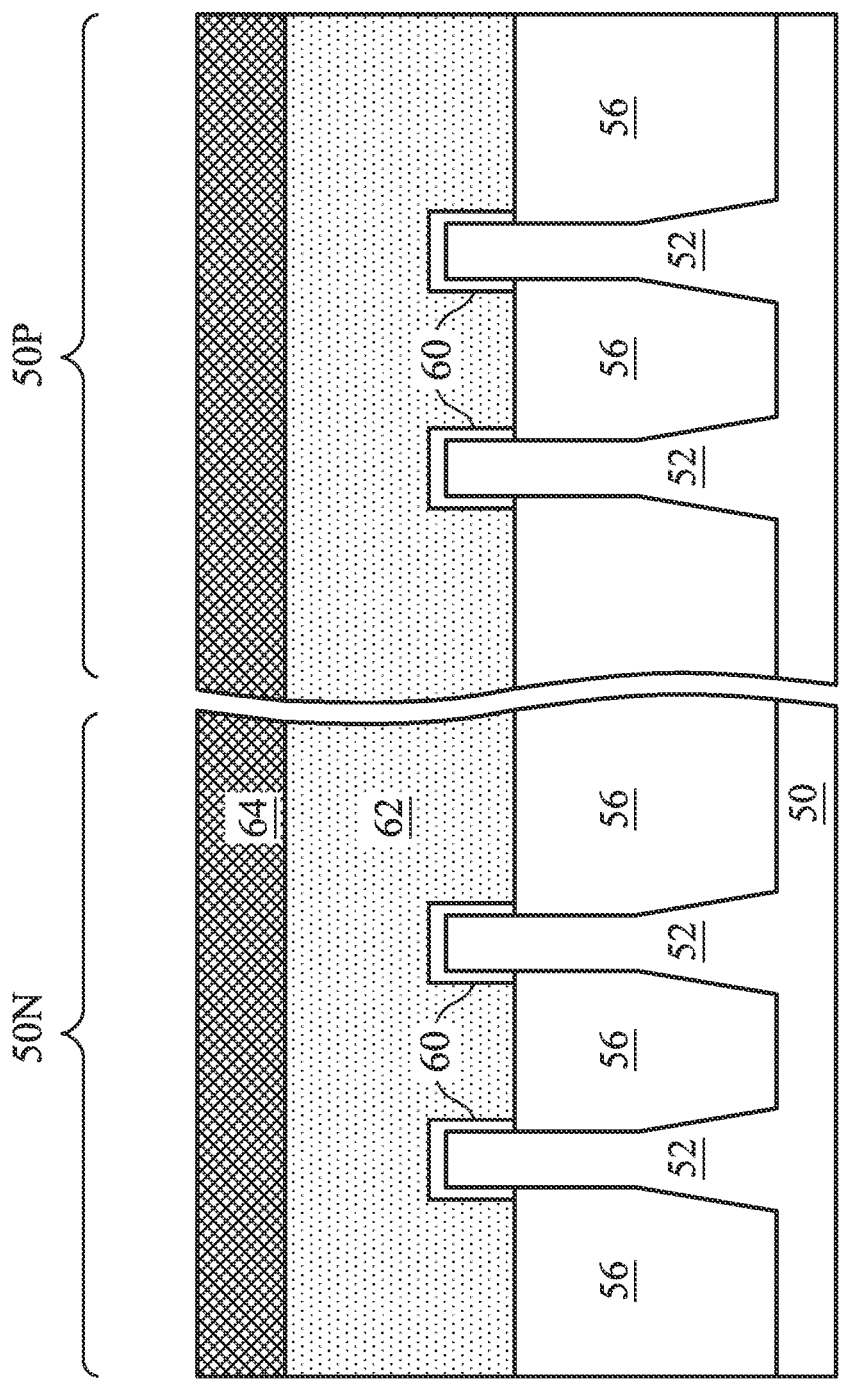

In FIG. 7, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques for depositing the selected material. The dummy gate layer 62 may be made of other materials that have a high etching selectivity from the etching of isolation regions, e.g., the STI regions 56 and/or the dummy dielectric layer 60. The mask layer 64 may include one or more layers of, for example, silicon nitride, silicon oxynitride, or the like. In this example, a single dummy gate layer 62 and a single mask layer 64 are formed across the n-type region 50N and the p-type region 50P. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending over the STI regions and between the dummy gate layer 62 and the STI regions 56.

FIGS. 8A through 16B illustrate various additional steps in the manufacturing of embodiment devices. FIGS. 8A through 16B illustrate features in either of the n-type region 50N and the p-type region 50P. For example, the structures illustrated in FIGS. 8A through 16B may be applicable to both the n-type region 50N and the p-type region 50P. Differences (if any) in the structures of the n-type region 50N and the p-type region 50P are described in the text accompanying each figure.

Figure 8A:
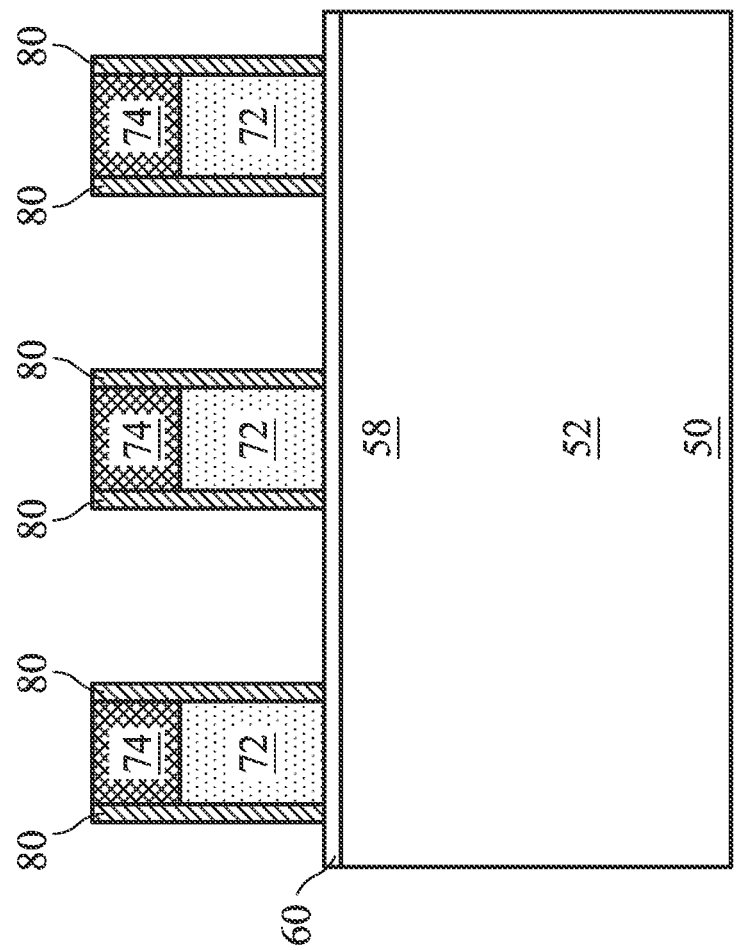
Figure 8B:
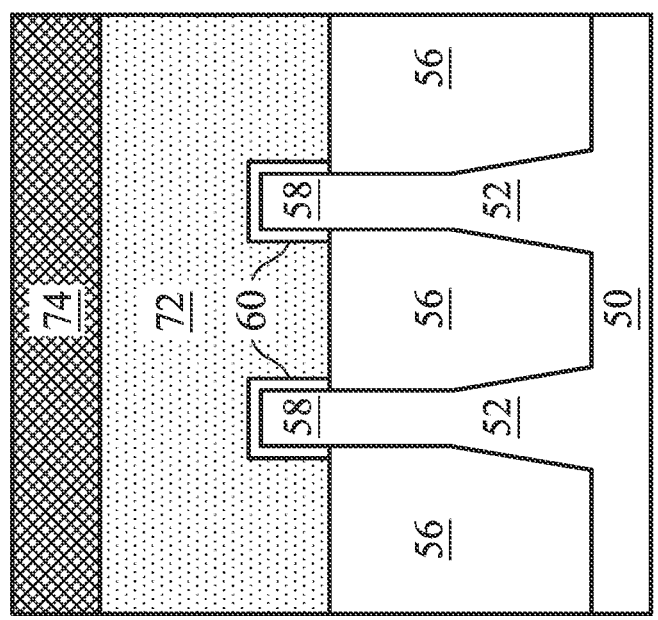

In FIGS. 8A and 8B, the mask layer 64 (see FIG. 7) may be patterned using acceptable photolithography and etching techniques to form masks 74. The pattern of the masks 74 then may be transferred to the dummy gate layer 62. In some embodiments (not illustrated), the pattern of the masks 74 may also be transferred to the dummy dielectric layer 60 by an acceptable etching technique to form dummy gates 72. The dummy gates 72 cover respective channel regions 58 of the fins 52. The pattern of the masks 74 may be used to physically separate each of the dummy gates 72 from adjacent dummy gates. The dummy gates 72 may also have a lengthwise direction substantially perpendicular to the lengthwise direction of respective epitaxial fins 52.

Further in FIGS. 8A and 8B, gate seal spacers 80 can be formed on exposed surfaces of the dummy gates 72, the masks 74, and/or the fins 52. A thermal oxidation or a deposition followed by an anisotropic etch may form the gate seal spacers 80. The gate seal spacers 80 may be formed of silicon oxide, silicon nitride, silicon oxynitride, or the like.

After the formation of the gate seal spacers 80, implants for lightly doped source/drain (LDD) regions (not explicitly illustrated) may be performed. In the embodiments with different device types, similar to the implants discussed above in FIG. 6, a mask, such as a photoresist, may be formed over the n-type region 50N, while exposing the p-type region 50P, and appropriate type (e.g., p-type) impurities may be implanted into the exposed fins 52 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 52 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{19}$ cm$^{-3}$. An anneal may be used to repair implant damage and to activate the implanted impurities.

In FIGS. 9A and 9B, gate spacers 86 are formed on the gate seal spacers 80 along sidewalls of the dummy gates 72 and the masks 74. The gate spacers 86 may be formed by conformally depositing an insulating material and subsequently anisotropically etching the insulating material. The insulating material of the gate spacers 86 may be silicon oxide, silicon nitride, silicon oxynitride, silicon carbonitride, a combination thereof, or the like.

It is noted that the above disclosure generally describes a process of forming spacers and LDD regions. Other processes and sequences may be used. For example, fewer or additional spacers may be utilized, different sequence of steps may be utilized (e.g., the gate seal spacers 80 may not be etched prior to forming the gate spacers 86, yielding "L-shaped" gate seal spacers, spacers may be formed and removed, and/or the like). Furthermore, the n-type and p-type devices may be formed using a different structures and steps. For example, LDD regions for n-type devices may be formed prior to forming the gate seal spacers 80 while the LDD regions for p-type devices may be formed after forming the gate seal spacers 80.

Figure 10A:
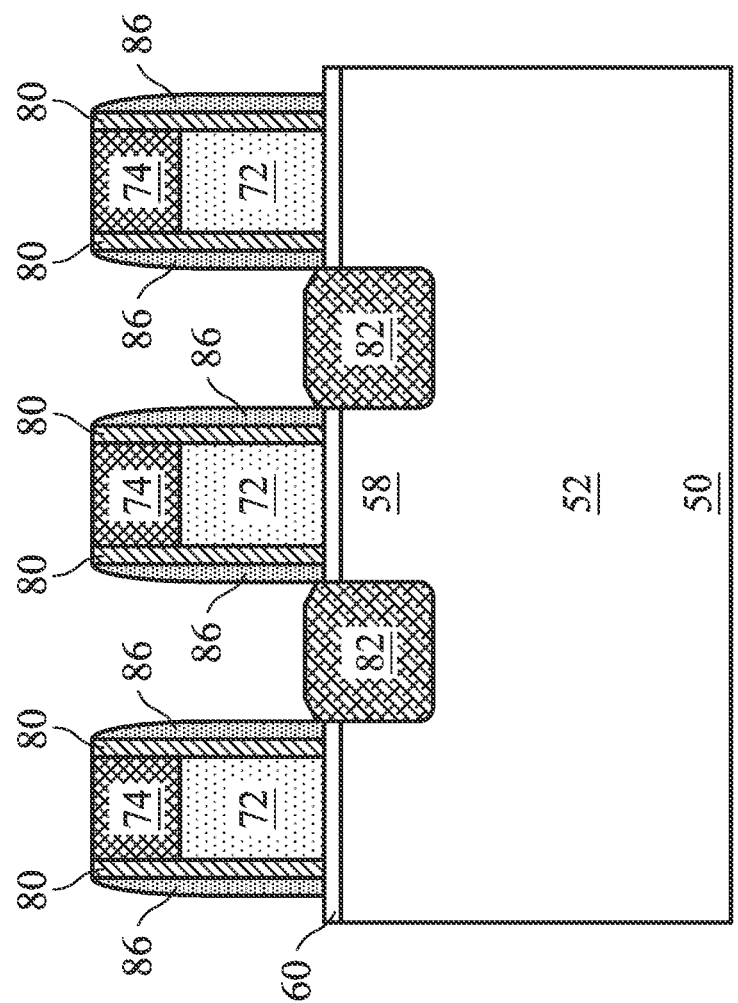
Figure 10B:
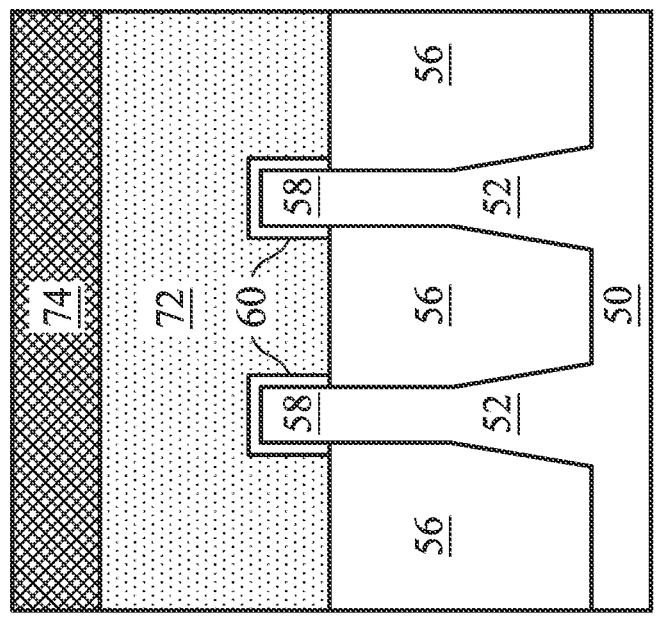
Figure 10D:
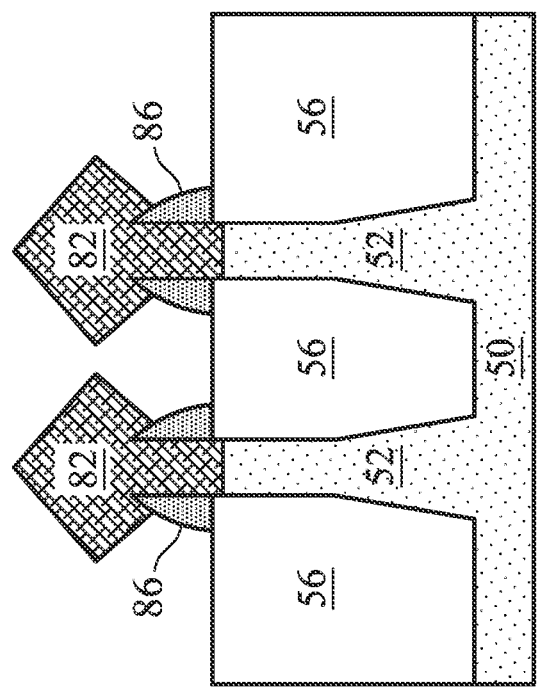
Figure 10C:
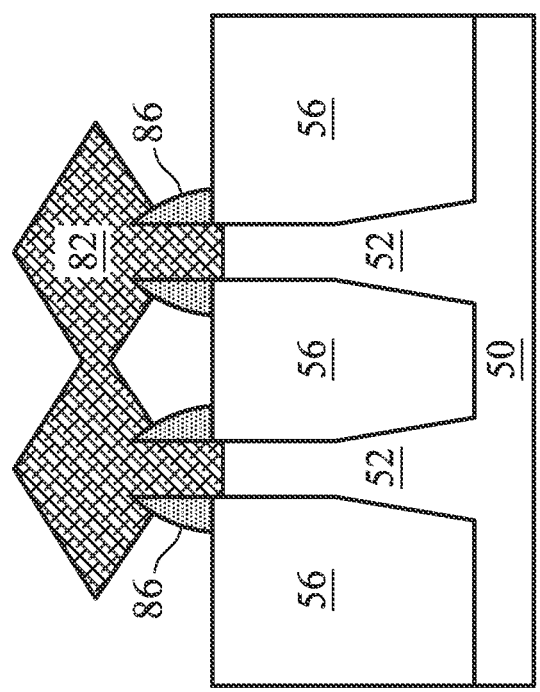

In FIGS. 10A and 10B epitaxial source/drain regions 82 are formed in the fins 52. The epitaxial source/drain regions 82 are formed in the fins 52 such that each dummy gate 72 is disposed between respective neighboring pairs of the epitaxial source/drain regions 82. In some embodiments the epitaxial source/drain regions 82 may extend into, and may also penetrate through, the fins 52. In some embodiments, the gate spacers 86 are used to separate the epitaxial source/drain regions 82 from the dummy gates 72 by an appropriate lateral distance so that the epitaxial source/drain regions 82 do not short out subsequently formed gates of the resulting FinFETs. A material of the epitaxial source/drain regions 82 may be selected to exert stress in the respective channel regions 58, thereby improving performance.

The epitaxial source/drain regions 82 in the n-type region 50N may be formed by masking the p-type region 50P and etching source/drain regions of the fins 52 in the n-type region 50N to form recesses in the fins 52. Then, the epitaxial source/drain regions 82 in the n-type region 50N are epitaxially grown in the recesses. The epitaxial source/drain regions 82 may include any acceptable material, such as appropriate for n-type FinFETs. For example, if the fin 52 is silicon, the epitaxial source/drain regions 82 in the n-type region 50N may include materials exerting a tensile strain in the channel region 58, such as silicon, silicon carbide, phosphorous doped silicon carbide, silicon phosphide, or the like. The epitaxial source/drain regions 82 in the n-type region 50N may have surfaces raised from respective surfaces of the fins 52 and may have facets.

The epitaxial source/drain regions 82 in the p-type region 50P may be formed by masking the n-type region 50N and etching source/drain regions of the fins 52 in the p-type region 50P to form recesses in the fins 52. Then, the epitaxial source/drain regions 82 in the p-type region 50P are epitaxially grown in the recesses. The epitaxial source/drain regions 82 may include any acceptable material, such as appropriate for p-type FinFETs. For example, if the fin 52 is silicon, the epitaxial source/drain regions 82 in the p-type region 50P may comprise materials exerting a compressive strain in the channel region 58, such as silicon-germanium, boron doped silicon-germanium, germanium, germanium tin, or the like. The epitaxial source/drain regions 82 in the p-type region 50P may have surfaces raised from respective surfaces of the fins 52 and may have facets.

The epitaxial source/drain regions 82 and/or the fins 52 may be implanted with dopants to form source/drain regions, similar to the process previously discussed for forming lightly-doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 82 may be in situ doped during growth.

As a result of the epitaxy processes used to form the epitaxial source/drain regions 82 in the n-type region 50N and the p-type region 50P, upper surfaces of the epitaxial source/drain regions have facets which expand laterally outward beyond sidewalls of the fins 52. In some embodiments, these facets cause adjacent source/drain regions 82 of a same FinFET to merge as illustrated by FIG. 10C. In other embodiments, adjacent source/drain regions 82 remain separated after the epitaxy process is completed as illustrated by FIG. 10D. In the embodiments illustrated in FIGS. 10C and 10D, gate spacers 86 are formed covering a portion of the sidewalls of the fins 52 that extend above the STI regions 56 thereby blocking the epitaxial growth. In some other embodiments, the spacer etch used to form the gate spacers 86 may be adjusted to remove the spacer material to allow the epitaxially grown region to extend to the surface of the STI region 56.

Figures 11A, 11B:
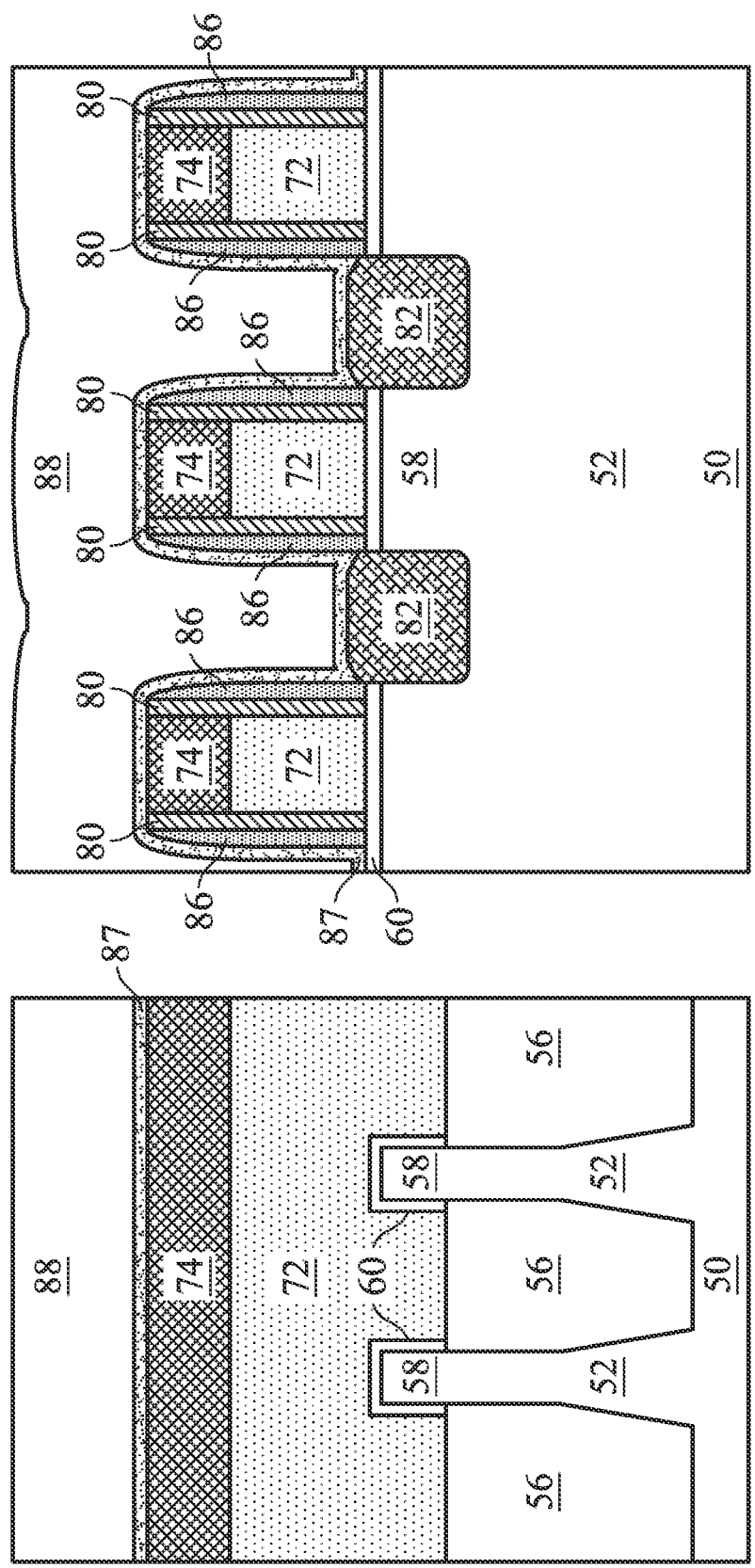

In FIGS. 11A and 11B, a first interlayer dielectric (ILD) 88 is deposited over the structure illustrated in FIGS. 10A and 10B. The first ILD 88 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 87 is disposed between the first ILD 88 and the epitaxial source/drain regions 82, the masks 74, and the gate spacers 86. The CESL 87 may comprise a dielectric material, such as silicon nitride, silicon oxide, silicon oxynitride, or the like, which may have a lower etch rate than the material of the overlying first ILD 88.

Figures 12A, 12B:
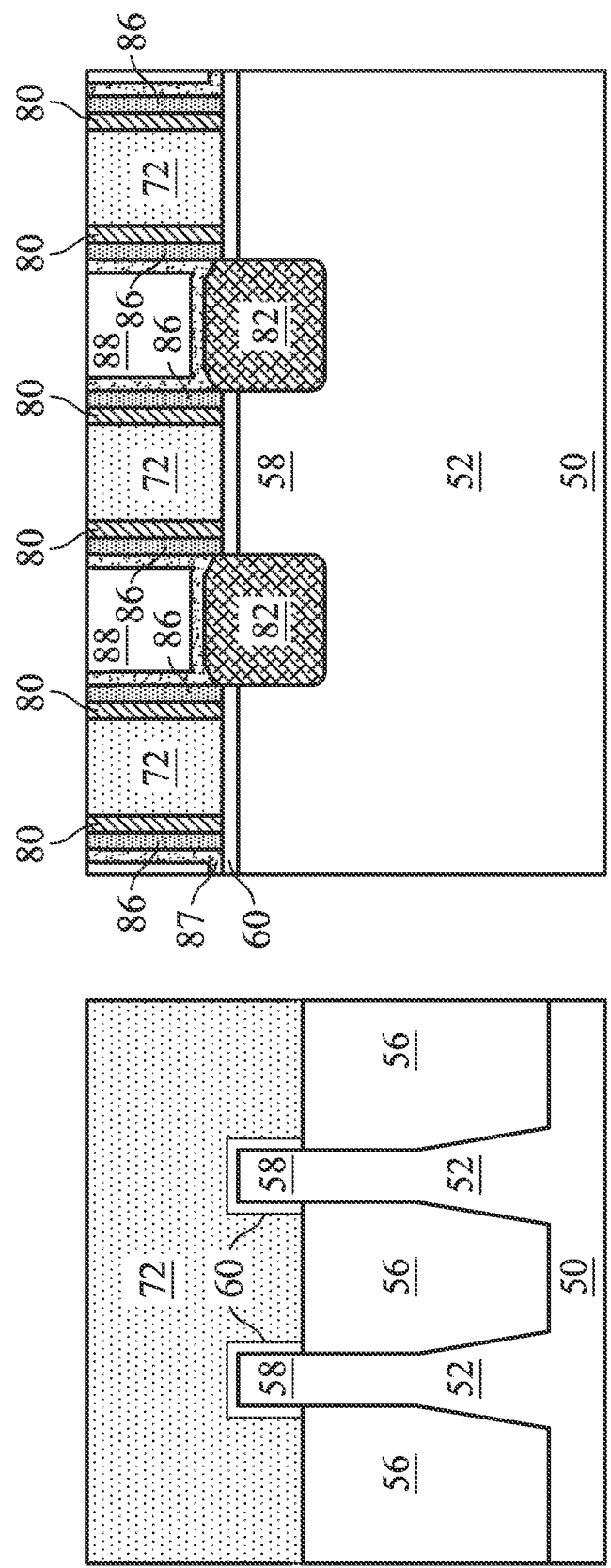

In FIGS. 12A and 12B, a planarization process, such as a CMP, may be performed to level the top surface of the first ILD 88 with the top surfaces of the dummy gates 72 or the masks 74. The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, and the first ILD 88 are level. Accordingly, the top surfaces of the dummy gates 72 are exposed through the first ILD 88. In some embodiments, the masks 74 may remain, in which case the planarization process levels the top surface of the first ILD 88 with the top surfaces of the masks 74.

Figures 13A, 13B:
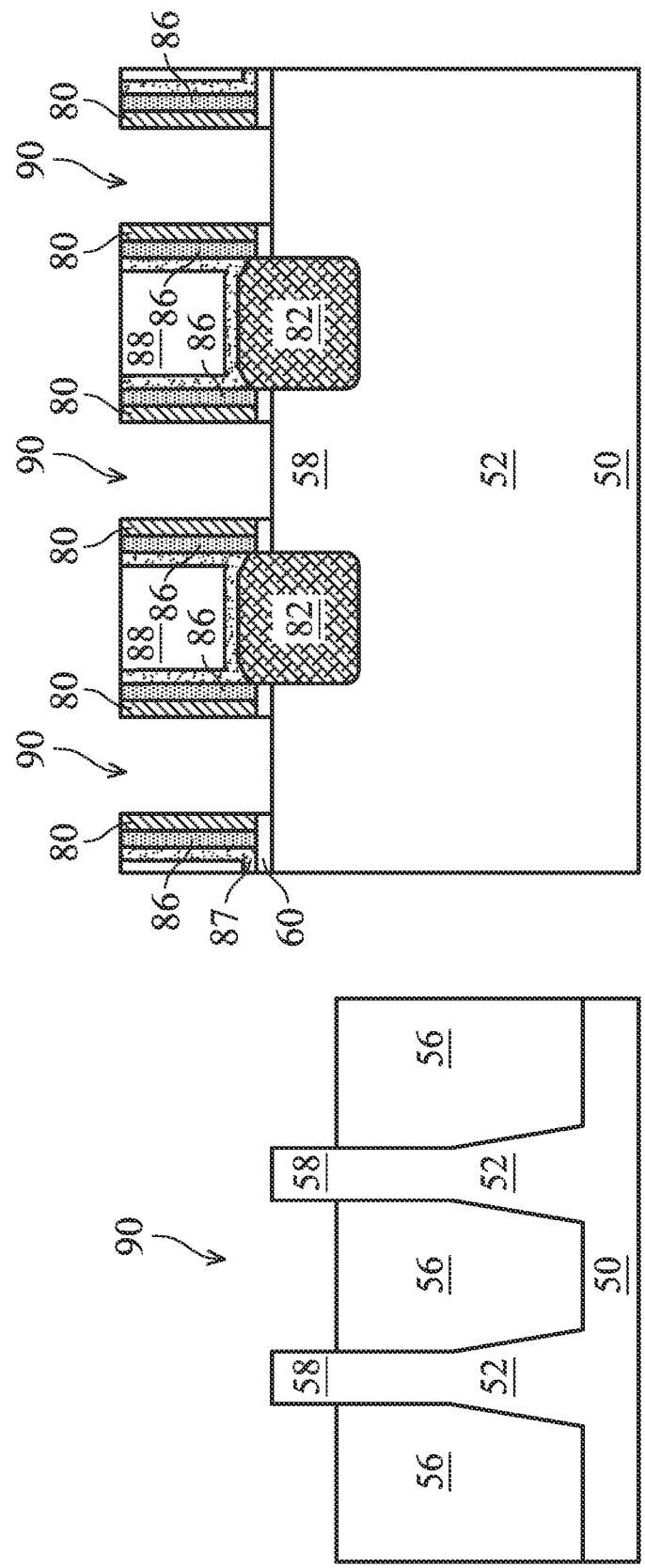

In FIGS. 13A and 13B, the dummy gates 72, and the masks 74 if present, are removed in an etching step(s), so that recesses 90 are formed. Portions of the dummy dielectric layer 60 in the recesses 90 may also be removed. In some embodiments, only the dummy gates 72 are removed and the dummy dielectric layer 60 remains and is exposed by the recesses 90. In some embodiments, the dummy dielectric layer 60 is removed from recesses 90 in a first region of a die (e.g., a core logic region) and remains in recesses 90 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 with little or no etching of the first ILD 88 or the gate spacers 86. Each recess 90 exposes and/or overlies a channel region 58 of a respective fin 52. Each channel region 58 is disposed between neighboring pairs of the epitaxial source/drain regions 82. During the removal, the dummy dielectric layer 60 may be used as an etch stop layer when the dummy gates 72 are etched. The dummy dielectric layer 60 may then be optionally removed after the removal of the dummy gates 72.

Figure 14B:
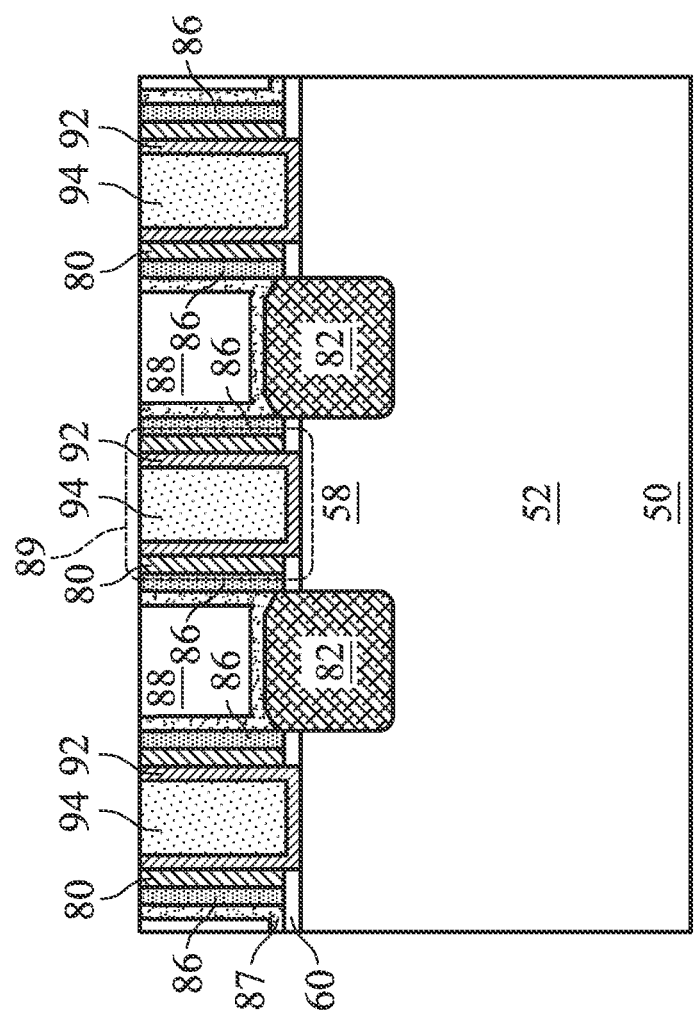
Figure 14A:
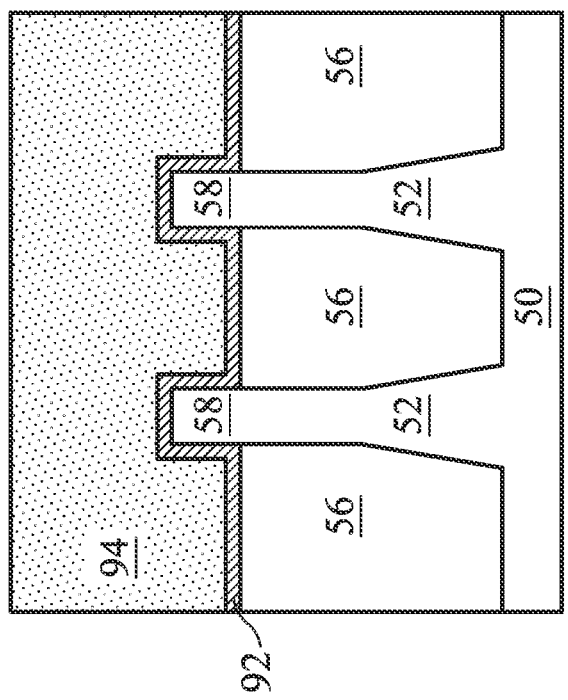
Figure 14C:
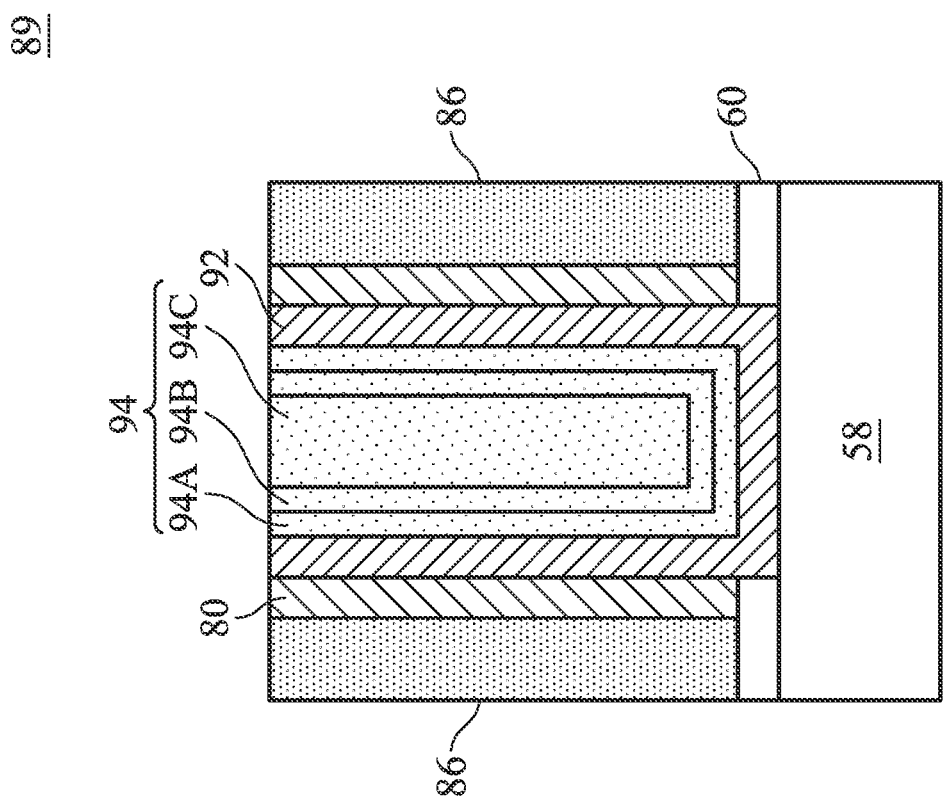

In FIGS. 14A and 14B, gate dielectric layers 92 and gate electrodes 94 are formed for replacement gates. FIG. 14C illustrates a detailed view of region 89 of FIG. 14B. Gate dielectric layers 92 are one or more layers deposited in the recesses 90, such as on the top surfaces and the sidewalls of the fins 52 and on sidewalls of the gate seal spacers 80/gate spacers 86. The gate dielectric layers 92 may also be formed on the top surface of the first ILD 88. In some embodiments, the gate dielectric layers 92 comprise one or more dielectric layers, such as one or more layers of silicon oxide, silicon nitride, metal oxide, metal silicate, or the like. For example, in some embodiments, the gate dielectric layers 92 include an interfacial layer of silicon oxide formed by thermal or chemical oxidation and an overlying high-k dielectric material, such as a metal oxide or a silicate of hafnium, aluminum, zirconium, lanthanum, manganese, barium, titanium, lead, and combinations thereof. The gate dielectric layers 92 may include a dielectric layer having a k value greater than about 7.0. The formation methods of the gate dielectric layers 92 may include Molecular-Beam Deposition (MBD), ALD, PECVD, and the like. In embodiments where portions of the dummy gate dielectric 60 remains in the recesses 90, the gate dielectric layers 92 include a material of the dummy gate dielectric 60 (e.g., $SiO_2$).

The gate electrodes 94 are deposited over the gate dielectric layers 92, respectively, and fill the remaining portions of the recesses 90. The gate electrodes 94 may include a metal-containing material such as titanium nitride, titanium oxide, tantalum nitride, tantalum carbide, cobalt, ruthenium, aluminum, tungsten, combinations thereof, or multi-layers thereof. For example, although a single layer gate electrode 94 is illustrated in FIG. 14B, the gate electrode 94 may comprise any number of liner layers 94A, any number of work function tuning layers 94B, and a fill material 94C as illustrated by FIG. 14C. After the filling of the recesses 90, a planarization process, such as a CMP, may be performed to remove the excess portions of the gate dielectric layers 92 and the material of the gate electrodes 94, which excess portions are over the top surface of the ILD 88. The remaining portions of material of the gate electrodes 94 and the gate dielectric layers 92 thus form replacement gates of the resulting FinFETs. The gate electrodes 94 and the gate dielectric layers 92 may be collectively referred to as a "gate stack." The gate and the gate stacks may extend along sidewalls of a channel region 58 of the fins 52.

The formation of the gate dielectric layers 92 in the n-type region 50N and the p-type region 50P may occur simultaneously such that the gate dielectric layers 92 in each region are formed from the same materials, and the formation of the gate electrodes 94 may occur simultaneously such that the gate electrodes 94 in each region are formed from the same materials. In some embodiments, the gate dielectric layers 92 in each region may be formed by distinct processes, such that the gate dielectric layers 92 may be different materials, and/or the gate electrodes 94 in each region may be formed by distinct processes, such that the gate electrodes 94 may be different materials. Various masking steps may be used to mask and expose appropriate regions when using distinct processes.

In some embodiments, a gate mask (not explicitly illustrated) is formed over the gate stack (including a gate dielectric layer 92 and a corresponding gate electrode 94), and the gate mask may be disposed between opposing portions of the gate spacers 86. In some embodiments, forming the gate mask includes recessing the gate stack so that a recess is formed directly over the gate stack and between opposing portions of gate spacers 86. A gate mask comprising one or more layers of dielectric material, such as silicon nitride, silicon oxynitride, or the like, may then be filled in the recess, followed by a planarization process to remove excess portions of the dielectric material extending over the first ILD 88.

Figures 15A, 15B:
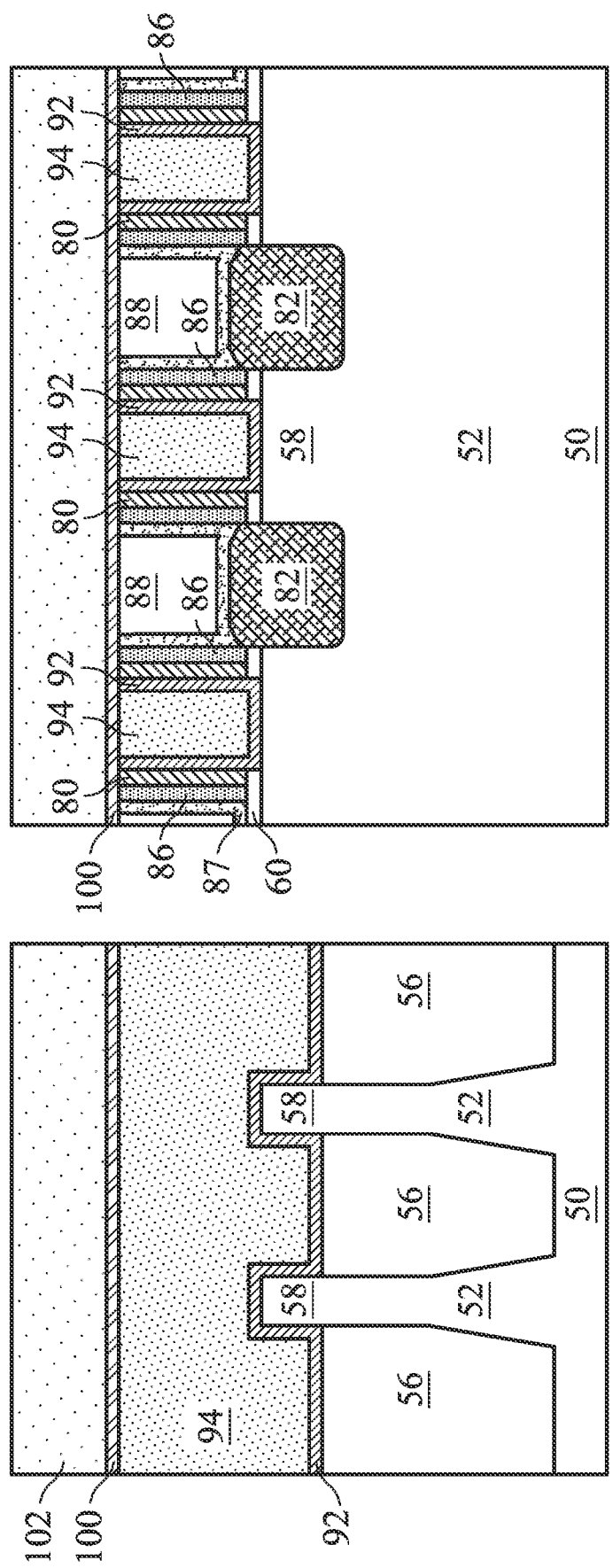

In FIGS. 15A and 15B, a second ILD 102 is deposited over the first ILD 88. In some embodiments, the second ILD 102 is a flowable film formed by a flowable CVD method. In some embodiments, the second ILD 102 may be a material similar to that of the first ILD 88, and may be formed in a similar manner. For example, the second ILD 102 may be formed of a dielectric material such as an oxide, PSG, BSG, BPSG, USG, or the like, and may be deposited by any suitable method, such as CVD or PECVD. In some embodiments, an optional etch stop layer 100 is formed before depositing the second ILD 102. The etch stop layer 100 may comprise a dielectric material, such as silicon nitride, silicon oxynitride, or the like, which may have a lower etch rate than the material of the overlying second ILD 102.

FIGS. 16A through 20B illustrate the formation of conductive features 108 (see FIG. 20B), in accordance with some embodiments. The conductive features 108 provide electrical connections to respective epitaxial source/drain regions 82 and in some cases may be considered "source/drain contact plugs" or the like. In some embodiments, the conductive features 108 are formed by depositing a second conductive material 106 (see FIGS. 18A-B) over a first conductive material 104 (see FIGS. 17A-B). In this manner, the first conductive material 104 may be an outer layer that at least partially surrounds an inner layer of the second conductive material 106. In some cases, the first conductive material 104 acts as a liner layer that improves adhesion of the second conductive material 106. In this manner, the second conductive material 106 may be considered a "filler layer" in some cases. In some embodiments, after depositing the second conductive material 106, a thermal process 107 (see FIGS. 19A-B) is performed that forms an intermixing interface 105 between the first conductive material 104 and the second conductive material 106, which can reduce resistance of the conductive features 108.

Figures 16A, 16B:
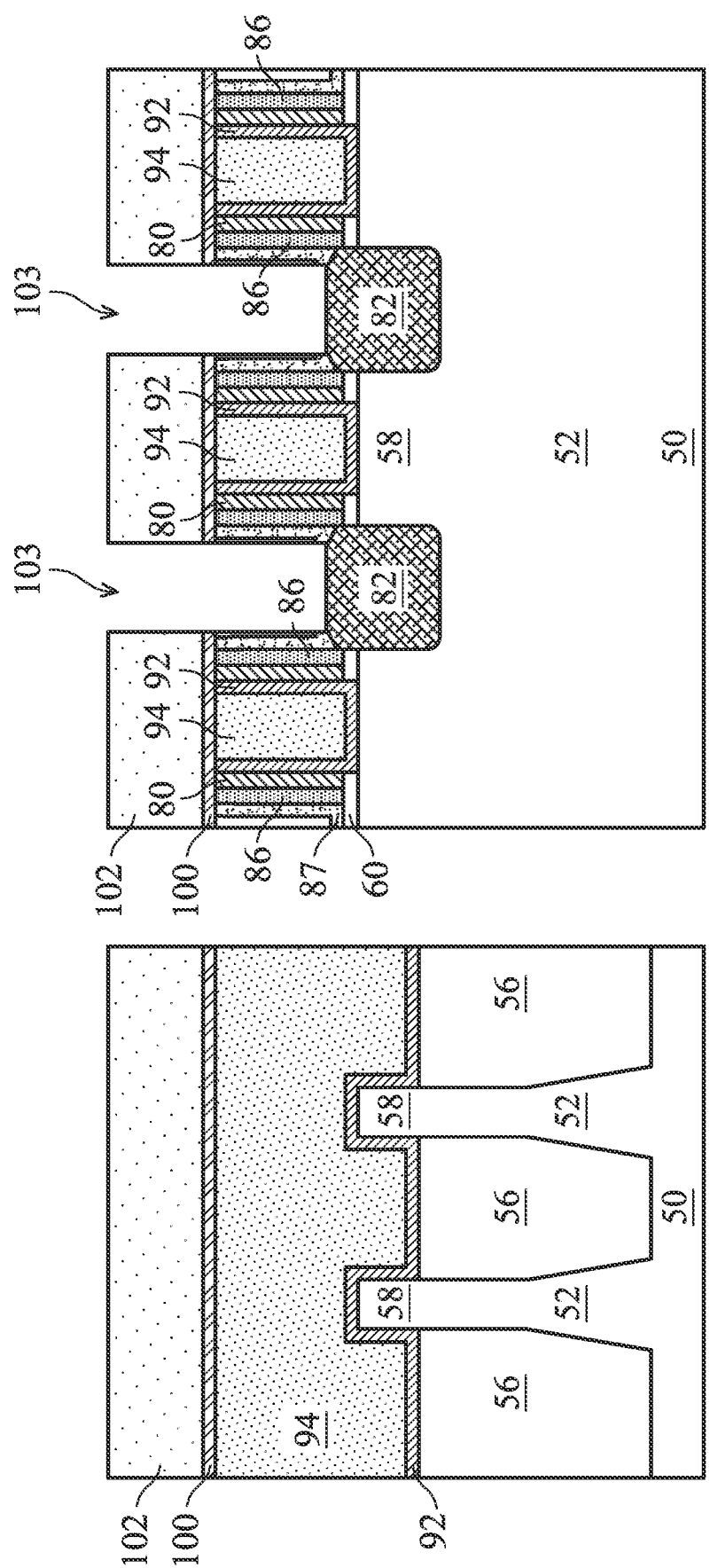

FIGS. 16A and 16B illustrate a patterning process of the second ILD 102, the etch stop layer 100, the first ILD 88, and the CESL 87 to form openings 103, in accordance with some embodiments. The openings 103 may expose surfaces of the source/drain regions 82. The patterning may be performed using acceptable photolithography and etching techniques. For example, a photoresist may be formed over the second ILD 102 and patterned. The photoresist can be formed by using, for example, a spin-on technique and can be patterned using acceptable photolithography techniques. One or more suitable etch processes may be performed using the patterned photoresist as an etch mask, forming the openings 103. The one or more etch processes may include wet and/or dry etch processes. In some embodiments, the one or more etch processes may be performed using etchants such as $CF_4$, $CHF_3$, $CH_2F_2$, $C_4F_6$, $C_4F_8$, Ar, $O_2$, $N_2$, $H_2$, the like, or combinations thereof. FIGS. 16A-B show the openings 103 as having substantially vertical sidewalls, but the openings 103 may have sloped sidewalls, curved sidewalls, or another sidewall profile in other embodiments.

Figures 17A, 17B:
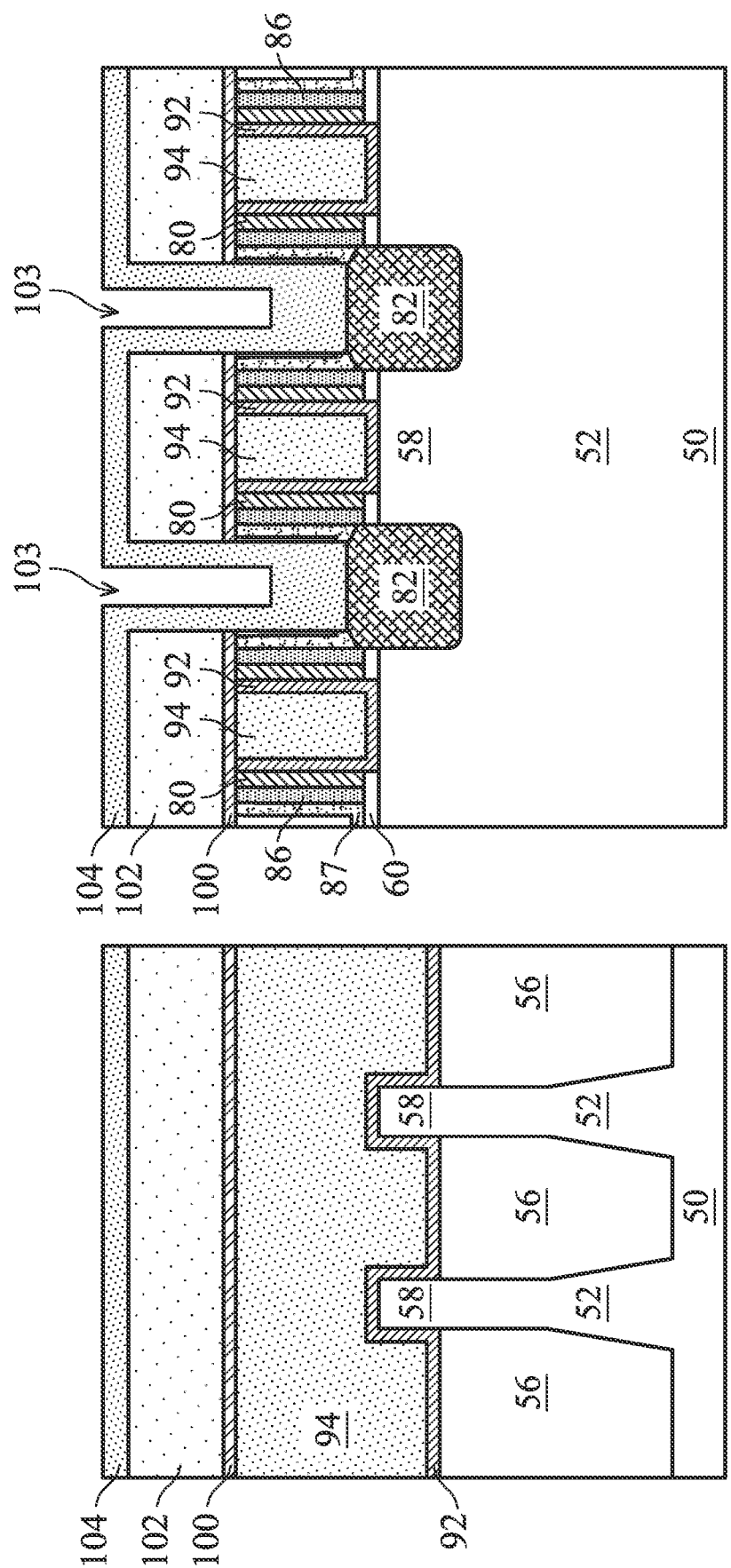

Referring to FIGS. 17A and 17B, the first conductive material 104 is deposited in the openings 103, in accordance with some embodiments. In some embodiment, before filling the openings 103 with the first conductive material 104, a cleaning process may be performed. In some embodiments, the cleaning process may be a plasma cleaning process using a process gas comprising $H_2$, $BCl_3$, $NF_3$, HF, HCl, $SiCl_4$, $Cl_2$, $SF_6$, $CF_4$, $CH_xF_y$, He, Ar, the like, or a combination thereof. Other cleaning processes are possible.

In some embodiments, the first conductive material 104 may comprise one or more metallic materials such as Ru, Ir, Ni, Os, Rh, Al, Mo, W, Co, Cu, Ag, a combination thereof, or the like. The first conductive material 104 may be deposited using a suitable technique such as CVD, PVD, ALD, an electrochemical plating process, an electroless plating process, a combination thereof, or the like. Other materials or deposition techniques are possible. In some embodiments, the first conductive material 104 is conformally deposited as a layer on sidewall surfaces and bottom surfaces of the openings 103, such as on exposed surfaces of the source/drain regions 82. The first conductive material 104 may also be deposited over the second ILD 102. In some embodiments, the first conductive material 104 is deposited to a thickness that is thick enough to allow continuous coverage of the sidewall surfaces and bottom surfaces of the openings 103. In some embodiments, the first conductive material 104 is deposited to a thickness that is thin enough to allow deposition of the second conductive material 106 thereon without forming seams or voids. For example, in some embodiments, the first conductive material 104 may be deposited to a thickness in the range of about 5 Å to about 100 Å, though other thicknesses are possible. In some cases, different regions of the first conductive material 104 within the openings 103 may have different thicknesses.

In some cases, conductive features formed from a metallic material may have increased resistance if one or more dimensions (e.g., the size) of the conductive features are about the same as or smaller than the electron mean free path of the metallic material. For example, in some cases, a thin film (e.g., having about 10 nm or less thickness, though other thicknesses are possible) of a metallic material may have a greater resistivity than that metallic material in bulk. This increase in resistivity for small feature sizes or thin films may be due to, for example, electron scattering effects. Thus, in some cases, the use of metallic materials having a relatively small electron mean free path can reduce the resistance of some relatively small conductive features. Accordingly, in some embodiments, the first conductive material 104 may comprise a metallic material having a relatively small electron mean free path. For example, in some embodiments, the metallic material of the first conductive material 104 may comprise a metal such as Rh, Ir, Ru, Ni, Os, Mo, or the like, that has an electron mean free path smaller than the electron mean free path of other metals such as W, Co, Cu, Ag, or the like. For example, in some embodiments, the metallic material of the first conductive material 104 is Ru, though other metallic materials may be used in other embodiments. In this manner, the choice of metallic material of the first conductive material 104 can allow for reduced resistance of the subsequently formed conductive features 108 (see FIG. 20B).

In some embodiments in which the first conductive material 104 comprises Ru, the first conductive material 104 may be deposited using CVD, PECVD, ALD, or the like. In some embodiments, the deposition process may be performed using a suitable precursor gas, such as $Ru(CO)_5$, $Ru_3(CO)_{12}$, $RuCl_3$, $Ru(od)_3$, Bis(cyclopentadienyl)ruthenium(II), $Ru(CO)_3C_6H_8$, $Ru(CO)_2(tmhd)_2$, $Ru(EtCp)_2$, $Ru(CO)_2(acac)_2$, $Ru(C_6H_6)(C_6H_8)$, $Ru(DMBD)(CO)_3$, amidamate-based or hexadiene-based Ru precursors, the like, or a combination thereof. In some embodiments, the precursor gas may have a flow rate in the range of about 10 sccm to about 100 sccm. In some embodiments, in addition to the precursor gas, a carrier gas and/or additional process gases may be used during the deposition. The carrier gas may comprise $N_2$, Ar, CO, $O_2$, a mixture thereof, or the like. The carrier gas may have a flow rate in the range of about 50 sccm to about 500 sccm. The additional process gas may comprise $H_2$, $O_2$, $NH_3$, a mixture thereof, or the like. The additional process gas may have a flow rate in the range of about 100 sccm to about 1000 sccm. In some embodiments, the deposition process may be performed at a process temperature in the range of about 75° C. to about 300° C. In some embodiment, the deposition process may be performed at a process pressure in the range of about 0.1 mTorr to about 10 mTorr. Other deposition techniques or parameters are possible.

In some embodiments in which the first conductive material 104 comprises Os, the first conductive material 104 may be deposited by CVD, PECVD, ALD, or the like using a suitable precursor gas, such as $Os_3(CO)_{12}$, or the like. In some embodiments in which the first conductive material 104 comprises Rh, the first conductive material 104 may be deposited by CVD, PECVD, ALD, or the like using a suitable precursor gas, such as $Rh_6(CO)_{16}$, or the like. In some embodiments in which the first conductive material 104 comprises Mo, the first conductive material 104 may be deposited by CVD, PECVD, ALD, or the like using a suitable precursor gas, such as $MoF_6$, $Mo(CO)_6$, $MoCl_5$, $MoO_xCl_y$, or the like. Other materials and precursor gases are possible.

Figures 18A, 18B:
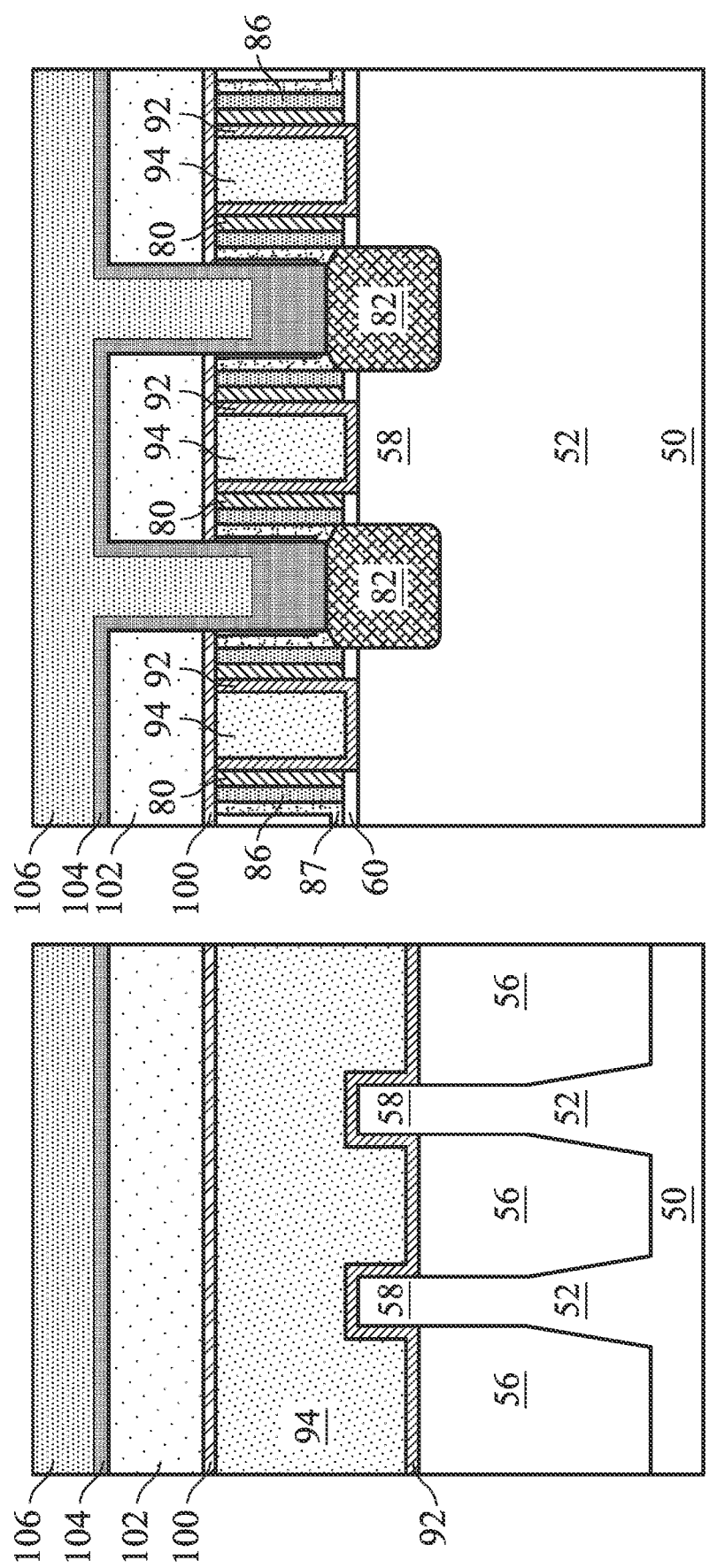

In FIGS. 18A and 18B, the second conductive material 106 is deposited over the first conductive material 104, in accordance with some embodiments. In some embodiments, the second conductive material 106 is deposited on the first conductive material 104 and fills the openings 103. The first conductive material 104 may also be deposited over the second ILD 102. In some embodiments, the second conductive material 106 may comprise one or more metallic materials such as Ru, Ir, Ni, Os, Rh, Al, Mo, W, Co, Cu, Ag, a combination thereof, or the like. In some embodiments, the second conductive material 106 is a different material than the first conductive material 104. In some embodiments, the second conductive material 106 may be a material less prone to seam merging than the first conductive material 104. By filling the openings 103 with a second conductive material 106 less prone to seam merging, effects due to seam merging such as stress or bending may be reduced. As an example, in some embodiments, the second conductive material 106 may be Co, which can be relatively less prone to seam merging, and the first conductive material 104 may be Ru, which can be relatively more prone to seam merging. This is an example, and other materials or combinations of materials may be used in other embodiments.

In some cases, the presence of the first conductive material 104 allows for better adhesion of the second conductive material 106 within the openings 103. In some embodiments, the second conductive material 106 may have a larger electron mean free path or a larger resistivity than the first conductive material 104. In some embodiments, the second conductive material 106 may have a smaller coefficient of thermal expansion (CTE) than the first conductive material 104, described in greater detail below. In some embodiments, the second conductive material 106 is a material that can form a homogeneous mixture with the first conductive material 104, described in greater detail below.

The second conductive material 106 may be deposited using a suitable technique such as CVD, PVD, ALD, an electrochemical plating process, an electroless plating process, a combination thereof, or the like. Other materials or deposition techniques are possible. In some embodiments, the first conductive material 104 is deposited to a thickness that is thick enough to fill the openings 103 without forming seams or voids. For example, in some embodiments, the second conductive material 106 may be deposited to a thickness in the range of about 5 Å to about 3000 Å, though other thicknesses are possible. In some embodiments, the ratio of the thickness of the first conductive material 104 to the thickness of the second conductive material 106 may be in the range of about 1:1.5 to about 1:9, though other ratios are possible.

In some embodiments, the second conductive material 106 may be a material that has a smaller coefficient of thermal expansion (CTE) than the first conductive material 104. In some cases, a material with a relatively high CTE can cause stress or bending (e.g., "thermal buckling") during subsequent processing at higher temperatures, such as during annealing steps or other processing steps. In some cases, forming conductive features of a conductive material with a relatively high CTE can result in stress, bending, and process defects due to thermal expansion. Thus, by forming conductive features using both a first conductive material 104 with a relatively larger CTE and a second conductive material 106 with a relatively smaller CTE, the stress or bending due to thermal expansion can be reduced, which can increase yield, device reliability, or device performance. As an example, in some embodiments, the first conductive material 104 may be Ru, which has a relatively larger CTE, and the second conductive material 106 may be Co, which has a relatively smaller CTE. This is an example, and other materials or combinations of materials may be used in other embodiments.

In some embodiments where the second conductive material 106 comprises Co, the second conductive material 106 may be deposited by CVD, PECVD, ALD, or the like using a suitable precursor gas, such as $Co_4(CO)_{12}$, $Co_2(CO)_8$, or the like. In some embodiments in which the second conductive material 106 comprises W, the second conductive material 106 may be deposited by CVD, PECVD, ALD, or the like using a suitable precursor gas, such as $W(CO)_6$, $W(F)_6$, or the like. Other materials and precursor gases are possible.

In FIGS. 19A-B, a thermal process 107 is performed on the first conductive material 104 and the second conductive material 106, in accordance with some embodiments. The thermal process 107 facilitates interdiffusion of the first conductive material 104 and/or the second conductive material 106, which can create an intermixing interface 105 between the first conductive material 104 and the second conductive material 106, in some embodiments. The intermixing interface 105 comprises regions in which both the first conductive material 104 and the second conductive material 106 are present (e.g., have nonzero concentrations). As an example, performing the thermal process 107 may cause an abrupt (e.g., step-like) concentration profile between the first conductive material 104 and the second conductive material 106 (e.g., as shown in FIGS. 18A-B) to become a smoother (e.g., gradient-like) concentration profile between the first conductive material 104 and the second conductive material 106 (e.g., as shown by the intermixing interface 105 in FIGS. 19A-B). In some embodiments, the intermixing interface 105 is bounded by regions of the first conductive material 104 and/or regions of the second conductive material 106. In some embodiments, during the thermal process 107, the first conductive material 104 may diffuse into the second conductive material 106 a distance in the range of about 0.1 Å to about 10 Å. In some embodiments, during the thermal process 107, the second conductive material 106 may diffuse into the first conductive material 104 a distance in the range of about 0.1 Å to about 10 Å. In this manner, in some embodiments, the intermixing interface 105 may have a width in the range of about 0.1 Å to about 10 Å. Other diffusion distances or widths of the intermixing interface 105 are possible.

In some embodiments, the first conductive material 104 and the second conductive material 106 may be different materials capable of forming a homogeneous mixture. In some embodiments, the first conductive material 104 and the second conductive material 106 may form a homogeneous mixture of any ratio under operating pressures and/or operating temperatures of the device. For example, Ru and Co can form a homogeneous mixture of any ratio in atmospheric pressure, though other materials are possible. In other embodiments, the first conductive material 104 and the second conductive material 106 may form a homogeneous mixture having a range of ratios and/or within a range of temperatures or pressures. In some cases, a homogeneous mixture of the first conductive material 104 and the second conductive material 106 can form an intermixing interface 105 having a smoother (e.g., less abrupt) concentration profile between the first conductive material 104 and the second conductive material 106, such as having a gradient concentration profile. In some cases, forming a homogeneous intermixing interface 105 having a gradient concentration profile in this manner can reduce interfacial scattering of electrons flowing between the first conductive material 104 and the second conductive material 106. For example, a homogeneous intermixing interface 105 having a gradient concentration profile can have a significantly smaller magnitude of electron scattering than an interface having an abrupt concentration profile. By reducing electron scattering in this manner, the resistance of conductive features formed of both the first conductive material 104 and the second conductive material 106 can be reduced by performing a thermal process 107 as described herein. This can allow for conductive features to be formed from multiple conductive materials without significantly increasing resistance.

In some embodiments, the thermal process 107 may be, for example, an annealing process, such as a rapid thermal anneal (RTA) process or the like. The thermal process 107 may be performed at a temperature in the range of about 100° C. to about 1000° C., in some embodiments. The thermal process 107 may be performed for a duration of time in the range of about 1 second to about 300 seconds, in some embodiments. In some embodiments, the thermal process 107 may be performed in a gas ambient comprising $N_2$, He, Ar, $H_2$, a forming gas (such as, for example, 5% by volume of $H_2$ in $N_2$), a mixture thereof, or the like. Other temperatures, time durations, or other process conditions for the thermal process 107 are possible.

Figures 20A, 20B:
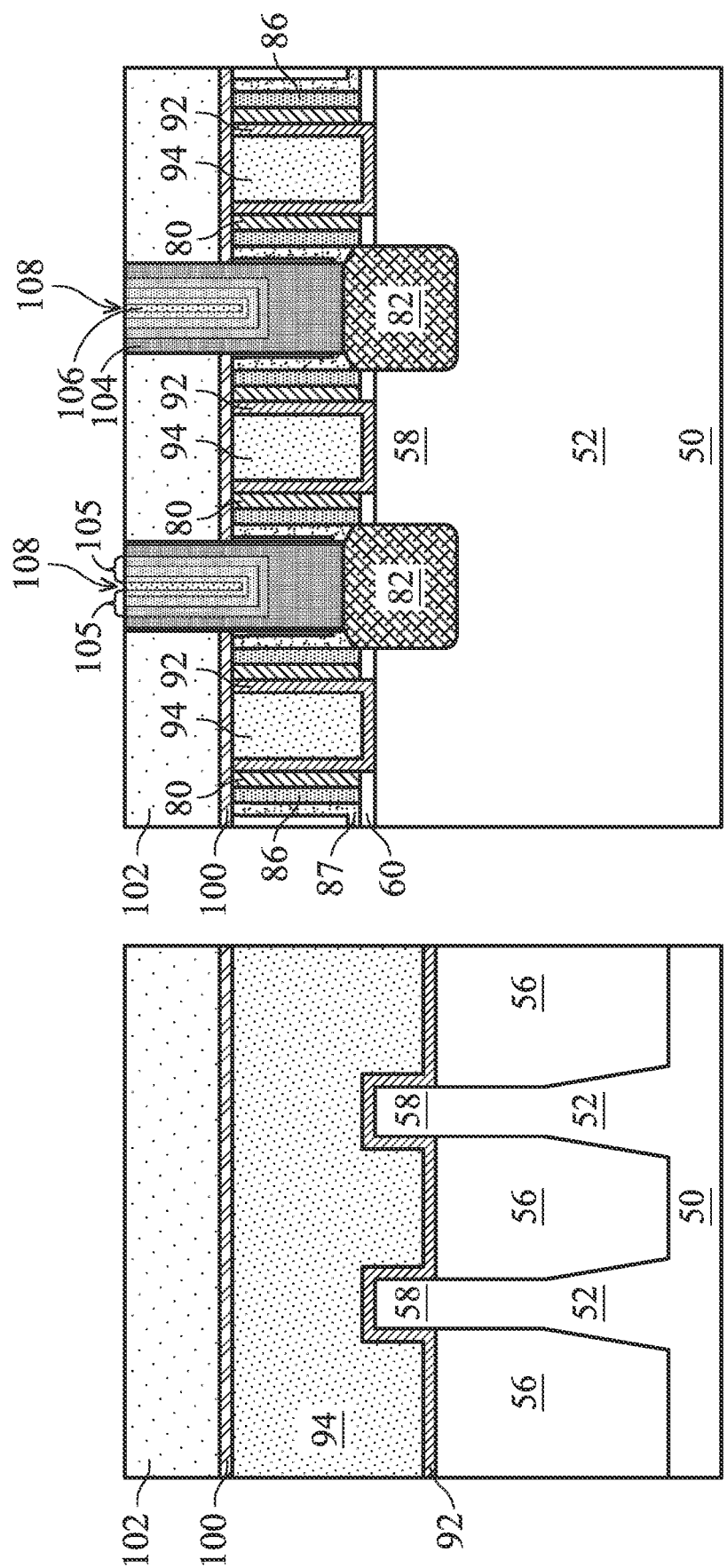

In FIGS. 20A-B, a planarization process is performed to remove excess first conductive material 104 and second conductive material 106 and form conductive features 108, in accordance with some embodiments. The planarization process may be a grinding process, a CMP process, or the like. In some embodiments, after performing the planarization process, surfaces of the conductive features 108 and the second ILD 102 may be substantially level. FIGS. 20A-B show the conductive features 108 as having substantially vertical sidewalls, but the conductive features 108 may have sloped sidewalls, curved sidewalls, or another sidewall profile in other embodiments.

The conductive features 108 may comprise regions of the first conductive material 104, regions of the second conductive material 106, and/or intermixing interfaces 105 (e.g., regions that comprise a mixture of both the first conductive material 104 and the second conductive material 106). For example, in some embodiments, the conductive features 108 comprise outer regions of the first conductive material 104 that at least partially surround inner regions of the second conductive material 106, with intermixing interfaces 105 extending between the outer regions of the first conductive material 104 and the inner regions of the second conductive material 106. In other embodiments, the conductive features 108 may comprise only an intermixing interface 105, only intermixing interfaces 105 and the first conductive material 104, or only intermixing interfaces 105 and the second conductive material 106. In some embodiments, an intermixing interface 105 extends from the first conductive material 104 near a first side of a conductive feature 108 to the first conductive material 104 near a second side of the conductive feature 108 that is opposite the first side. In some embodiments, an intermixing interface 105 extends fully from a first side of a conductive feature 108 to a second side of the conductive feature 108 that is opposite the first side. In some embodiments, an intermixing interface 105 extends to the bottom of a conductive feature 108 (e.g., to the corresponding source/drain region 82). After performing the planarization process, the top surfaces of the conductive features 108 may comprise exposed surfaces of the first conductive material 104, the second conductive material 106, and/or an intermixing interface 105, in some embodiments.

Figures 22A, 22B:
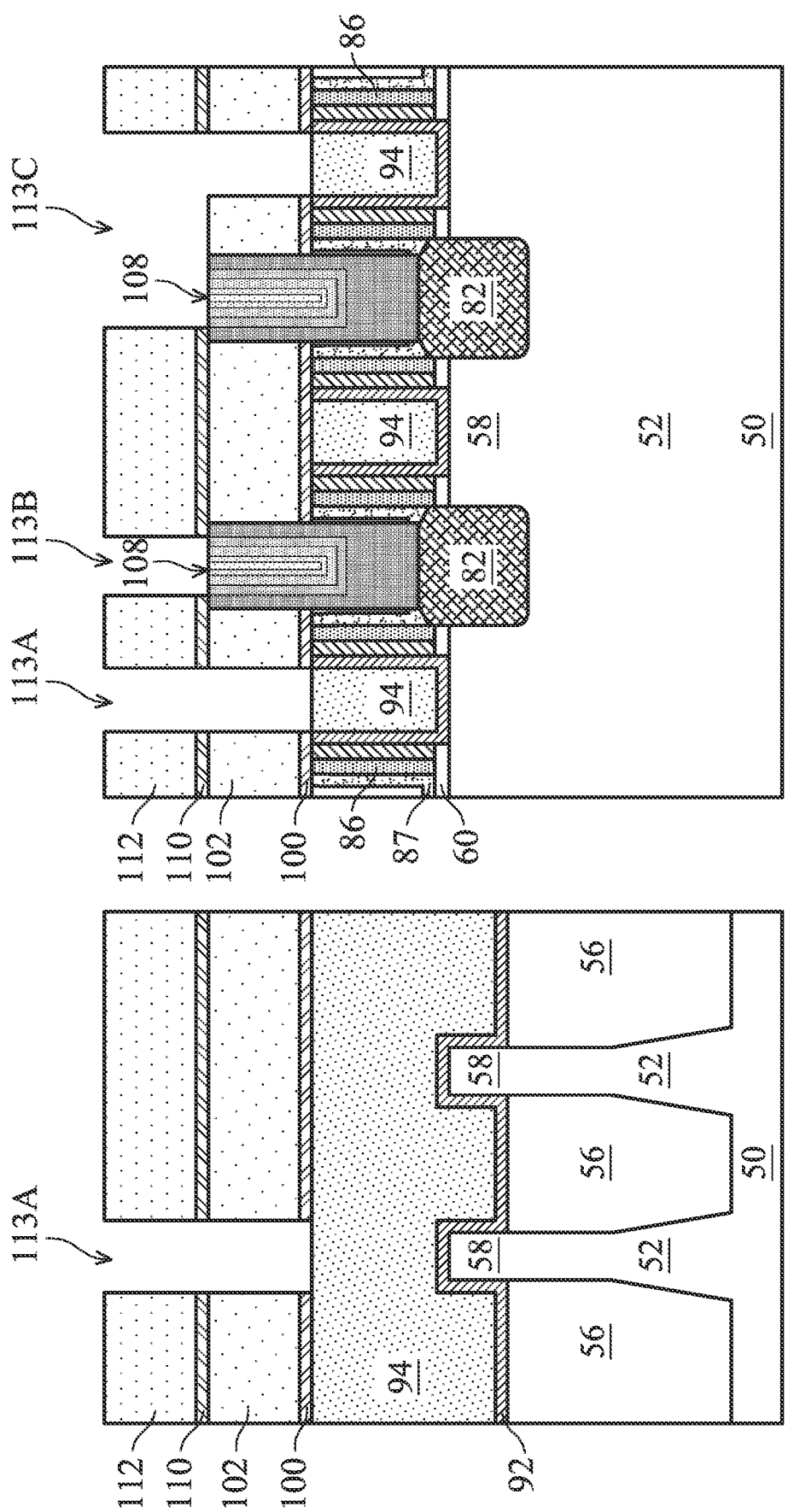
Figures 23A, 23B:
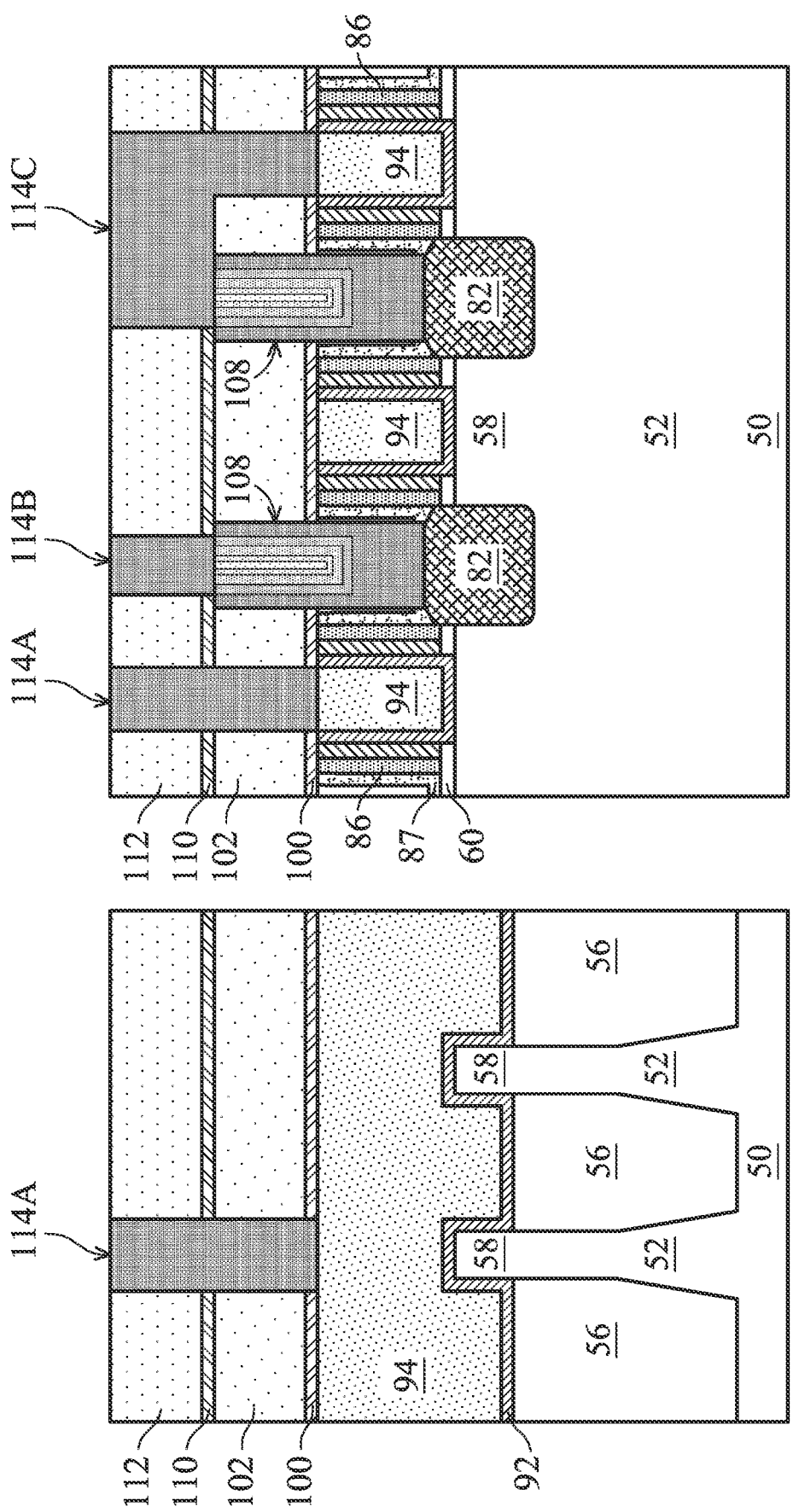

FIGS. 20A through 23B illustrate the formation of conductive features 114A, 114B, and 114C (see FIGS. 23A-B), in accordance with some embodiments. The conductive features 114A provide electrical connections to the gate electrodes 94 of respective gate stacks and in some cases may be considered "gate contact plugs" or the like. The conductive features 114B provide electrical connections to respective conductive features 108 and in some cases may be considered "conductive vias" or the like. The conductive features 114C are electrically connected to both conductive features 108 and gate electrodes 94. In FIGS. 23A-B, the conductive features 114A, 114B, and 114C are illustrated in a same plane, but in other embodiments the conductive features 114A, 114B, and/or 114C may be formed in different planes. The process shown in FIGS. 20A-23B is an example, and the conductive features 114A-C may be formed using any suitable process such as a damascene process, a dual damascene process, or another process.

Figures 21A, 21B:
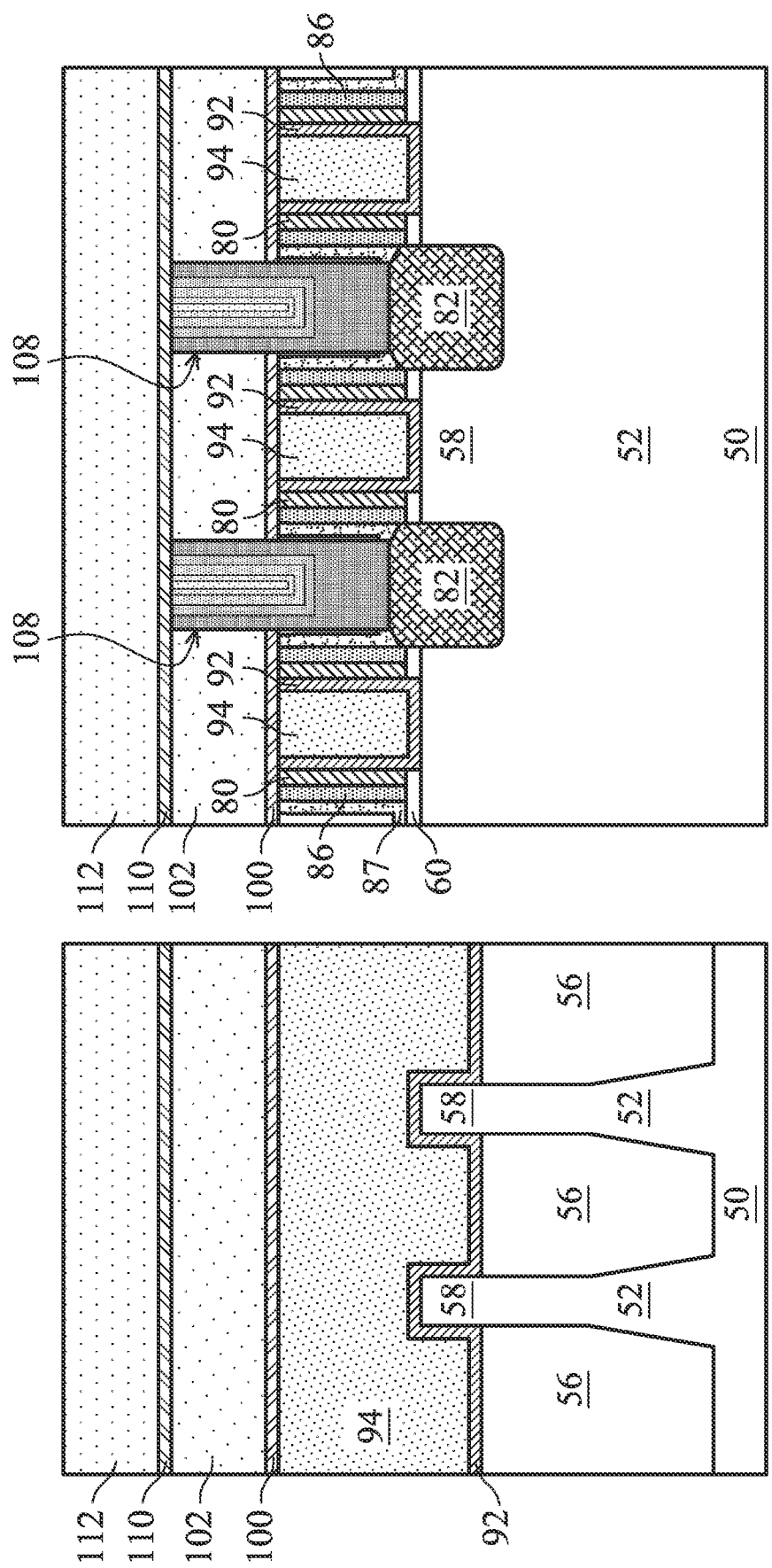

In FIGS. 21A and 21B, a dielectric layer 112 is deposited over the second ILD 102 and the conductive features 108. In some embodiments, the dielectric layer 112 is a flowable film formed by a flowable CVD method. In some embodiments, the dielectric layer 112 may be a material similar to that of the first ILD 88 or the second ILD 102, and may be formed in a similar manner. For example, the dielectric layer 112 may be formed of a dielectric material such as an oxide, PSG, BSG, BPSG, USG, or the like, and may be deposited by any suitable method, such as CVD or PECVD. The dielectric layer 112 may be another material than these examples. In some cases, the dielectric layer 112 may be considered a "third ILD." In some embodiments, an optional etch stop layer 110 is formed before depositing the dielectric layer 112. The etch stop layer 110 may be a material similar to those described for the etch stop layer 100 (see FIGS. 15A-B) and may be formed using similar techniques, or the etch stop layer 110 may be a material different than those described for the etch stop layer 100.

FIGS. 22A and 22B illustrate a patterning process of the dielectric layer 112, the etch stop layer 110, the second ILD 102, and the etch stop layer 100 to form openings 113A-C, in accordance with some embodiments. The openings 113A-C may expose surfaces of gate electrodes 94 and/or conductive features 108. For example, openings 113A may expose surfaces of gate electrodes 94 and openings 113B may expose surfaces of conductive features 108. Openings 113C may expose surfaces of gate electrodes 94, surfaces of conductive features 108, and top surfaces of the second ILD 102, in some embodiments.

The patterning of the openings 113A-C may be performed using one or more acceptable photolithography and etching techniques. For example, a photoresist may be formed over the dielectric layer 112 and patterned. The photoresist can be formed by using, for example, a spin-on technique and can be patterned using acceptable photolithography techniques. One or more suitable etch processes may be performed using the patterned photoresist as an etch mask, forming the openings 113A-C. The one or more etch processes may include wet and/or dry etch processes, which may be similar to those described previously for forming the openings 103 (see FIGS. 16A-B), in some embodiments. The openings 113A, 113B, and/or 113C may be patterned simultaneously or in separate patterning steps. FIGS. 22A-B show the openings 113A-C as having substantially vertical sidewalls, but the openings 113A-C may have sloped sidewalls, curved sidewalls, or another sidewall profile in other embodiments.

In FIGS. 23A and 23B, a conductive material is deposited in the openings 113A-C, forming conductive features 114A-C, in accordance with some embodiments. The conductive material fills the openings 113A-C to form the conductive features 114A-C. In some embodiments, the conductive material may comprise one or more metallic materials such as Ru, Ir, Ni, Os, Rh, Al, Mo, W, Co, Cu, Ag, a combination thereof, or the like. The conductive material may be deposited using a suitable technique such as CVD, PVD, ALD, an electrochemical plating process, an electroless plating process, a combination thereof, or the like. Other materials or deposition techniques are possible. In some embodiments, the conductive material is similar to the first conductive material 104 or the second conductive material 106 of the conductive features 108 and may be formed in a similar manner. For example, in some embodiments, the conductive features 108 comprise Ru and Co, and the conductive material is Ru or Co. Other materials or combinations of materials are possible. In other embodiments, the conductive material is different from the first conductive material 104 and/or the second conductive material 106. The conductive material may be deposited over the dielectric layer 112. A planarization process (e.g., grinding, CMP, or the like) may be performed to remove excess conductive material from the dielectric layer 112, and may result in surfaces of the dielectric material 112 and the conductive features 114A-C being substantially level. FIGS. 23A-B show the conductive features 114A-C as having substantially vertical sidewalls, but the conductive features 114A-C may have sloped sidewalls, curved sidewalls, or another sidewall profile in other embodiments.

Figures 24A, 24B:
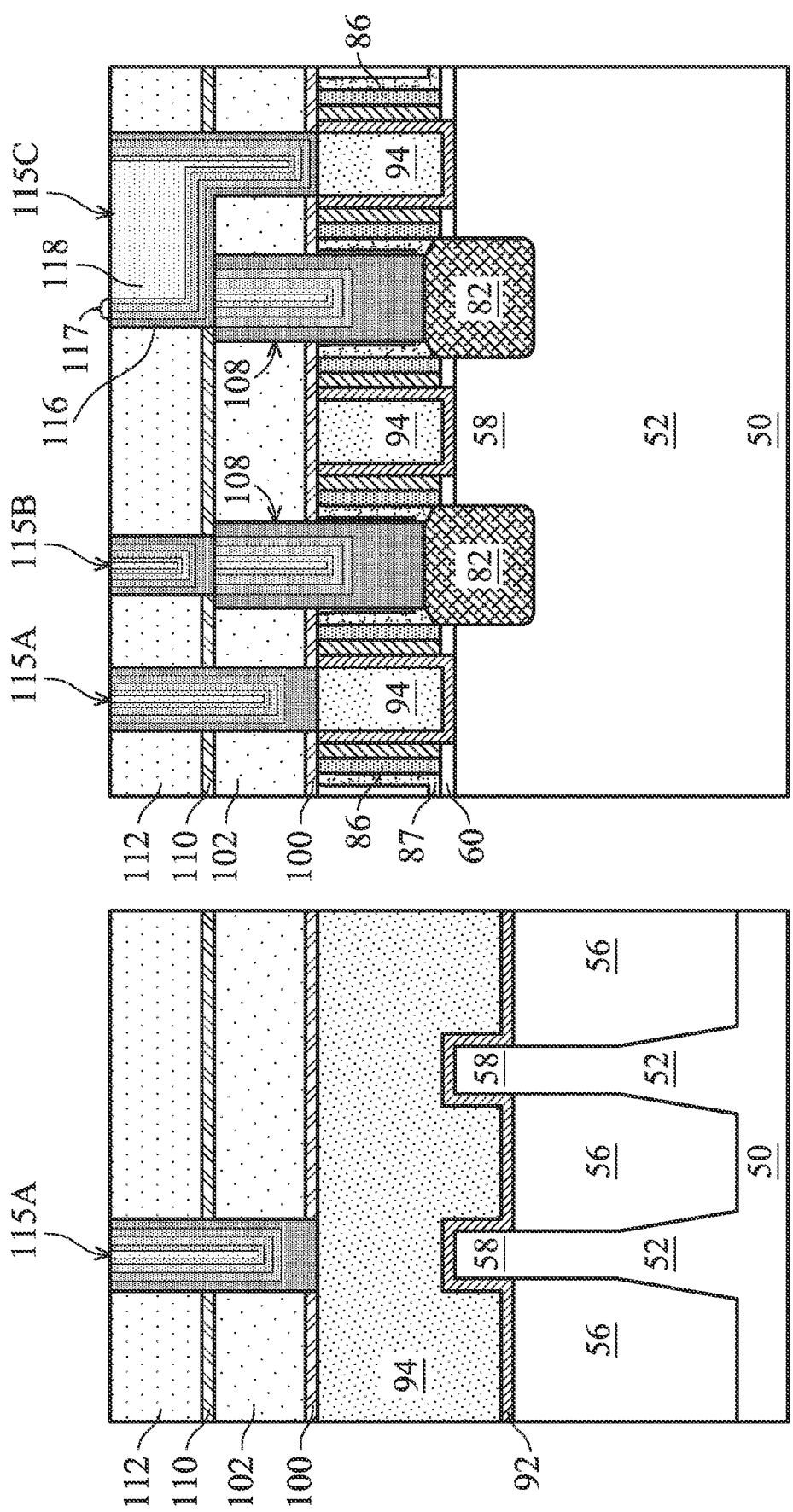

FIGS. 24A and 24B illustrate the formation of conductive features 115A-C comprising a first conductive material 116 and a second conductive material 118, in accordance with some embodiments. The conductive features 115A-C are similar to the conductive features 114A-C of FIGS. 23A-B, except that the conductive features 115A-C are formed of more than one conductive material. In some embodiments, the conductive features 115A-C are formed of a first conductive material 116 and a second conductive material 118. The first conductive material 116 may be a material similar to those described for the first conductive material 104 (see FIGS. 17A-B) and may be deposited using similar techniques. The second conductive material 118 may be a material similar to those described for the second conductive material 106 (see FIGS. 18A-B), and may be deposited using similar techniques. Other materials and deposition techniques are possible. The first conductive material 116 and/or the second conductive material 118 of the conductive features 115A-C may be the same or different than the first conductive material 104 and/or the second conductive material 106 of the underlying conductive features 108.

In some embodiments, the conductive features 115A-C are formed using a process similar to that described previously for the conductive features 108. For example, the conductive features 115A-C may be formed by depositing the first conductive material 116 within the openings 113A-C, and then deposition the second conductive material 118 over the first conductive material 116. In some embodiments, after depositing the second conductive material 118, a thermal process is performed that forms an intermixing interface 117 between the first conductive material 116 and the second conductive material 118, which can reduce resistance of the conductive features 115A-C. The thermal process may be similar to the thermal process 107 described previously, and the intermixing interface 117 may have characteristics similar to those described for the intermixing interface 105 described previously (see FIGS. 19A-B). In some embodiments, before forming the conductive features 115A-C, a first thermal process is performed to form the intermixing interface 105 of the conductive features 108. A second thermal process is then performed to form the intermixing interface 117 of the conductive features 115A-C. In other embodiments, a single thermal process is performed to form both the intermixing interface 105 of the conductive features 108 and the intermixing interface 117 of the conductive features 115A-C. By forming the conductive features 115A-C in this manner, the conductive features 115A-C may have similar advantages as described previously for the conductive features 108, such as improved reliability and reduced resistance.

FIGS. 25A and 25B illustrate the formation of conductive features 122A-C and conductive features 128A-C, in accordance with some embodiments. The structure shown in FIGS. 25A-B may be subsequently processed from the structure shown in FIGS. 23A-B. In other embodiments, a structure similar to that shown in FIGS. 25A-B may be subsequently processed from the structure shown in FIGS. 24A-B. The conductive features 122A-C and the conductive features 128A-C may be electrically connected to conductive features 114A-C and may provide additional electrical interconnections within the structure. In this manner, the conductive features 122A-C and/or the conductive features 128A-C may comprise electrical routing, conductive vias, conductive lines, or the like. In some embodiments, additional layers of conductive features may be formed on the conductive features 128A-C. In some embodiments, one or both of the conductive features 122A-C or the conductive features 128A-C are not formed. The conductive features 122A-C and the conductive features 128A-C may be formed using a suitable process, such as a damascene process, a dual damascene process, or another process. In some embodiments, the conductive features 122A-C and/or the conductive features 128A-C may be formed using a process similar to that described for forming the conductive features 115A-C.

As an example process of forming the conductive features 122A-C, a dielectric layer 120 may be formed over the dielectric layer 112 and the conductive features 114A-C. The dielectric layer 120 may be similar to the dielectric layer 112, and may be formed using similar techniques. An optional etch stop layer 118 may be formed between the dielectric layer 112 and the dielectric layer 120, which may be similar to the etch stop layer 110 described previously. Other materials or techniques are possible. Openings may then be patterned in the dielectric layer 120 and the etch stop layer 118 to expose surfaces of the conductive features 114A-C. A conductive material may be deposited within the openings to form the conductive features 122A-C. The conductive material may be similar to those described for the conductive features 114A-C (see FIGS. 23A-B), and may be formed in a similar manner. Other conductive materials are possible. A planarization process may be performed to remove excess conductive material from the dielectric layer 120. FIGS. 25A-B show the conductive features 122A-C as having substantially vertical sidewalls, but the conductive features 122A-C may have sloped sidewalls, curved sidewalls, or another sidewall profile in other embodiments.

In some embodiments, the conductive features 122A-C may be formed in a manner similar to the conductive features 115A-C (see FIG. 24A-B) or the conductive features 210 described below for FIGS. 26A-F. For example, a first conductive material may be deposited within the openings, and a second conductive material then deposited on the first conductive material. A thermal process may then be performed to form an intermixing interface between the first conductive material and the second conductive material. The first conductive material may be similar to the first conductive material 116, the second conductive material may be similar to the second conductive material 118, the intermixing interface may be similar to the intermixing interface 117, and the thermal process may be similar to the thermal process 107. Other materials or techniques are possible.

As an example process of forming the conductive features 128A-C, a dielectric layer 126 may be formed over the dielectric layer 120 and the conductive features 122A-C. The dielectric layer 126 may be similar to the dielectric layer 112, and may be formed using similar techniques. An optional etch stop layer 124 may be formed between the dielectric layer 120 and the dielectric layer 126, which may be similar to the etch stop layer 110 described previously. Other materials or techniques are possible. Openings may then be patterned in the dielectric layer 126 and the etch stop layer 124 to expose surfaces of the conductive features 122A-C. A conductive material may be deposited within the openings to form the conductive features 128A-C. The conductive material may be similar to those described for the conductive features 114A-C(see FIGS. 23A-B), and may be formed in a similar manner. Other conductive materials are possible. A planarization process may be performed to remove excess conductive material from the dielectric layer 126. FIGS. 25A-B show the conductive features 128 as having substantially vertical sidewalls, but the conductive features 128 may have sloped sidewalls, curved sidewalls, or another sidewall profile in other embodiments.

In some embodiments, the conductive features 128A-C may be formed in a manner similar to the conductive features 115A-C(see FIG. 24A-B) or the conductive features 210 described below for FIGS. 26A-F. For example, a first conductive material may be deposited within the openings, and a second conductive material then deposited on the first conductive material. A thermal process may then be performed to form an intermixing interface between the first conductive material and the second conductive material. The first conductive material may be similar to the first conductive material 116, the second conductive material may be similar to the second conductive material 118, the intermixing interface may be similar to the intermixing interface 117, and the thermal process may be similar to the thermal process 107. Other materials or techniques are possible.

Figure 26A:
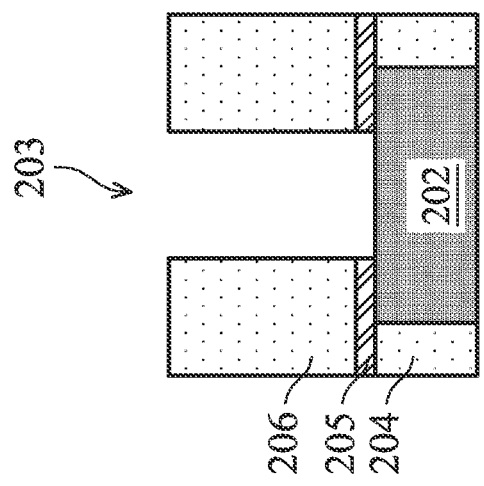
FIGS. 26A, 26B, 26C, 26D, 26E, and 26F are cross-sectional views of intermediate stages in the manufacturing of conductive features, in accordance with some embodiments.
Figure 26B:
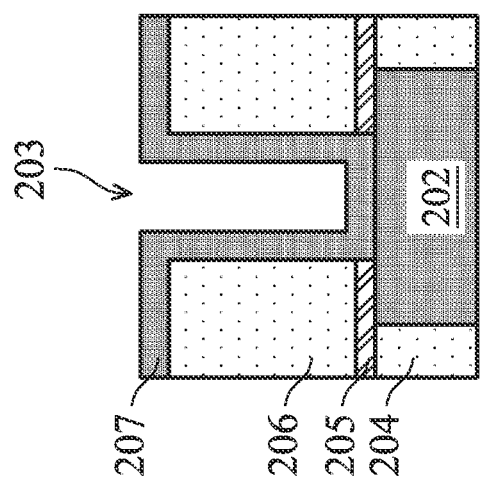
Figure 26C:
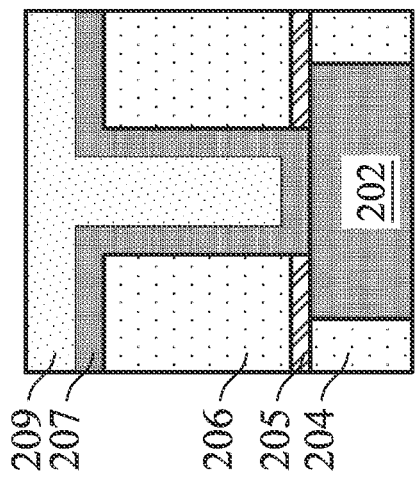
Figure 26D:
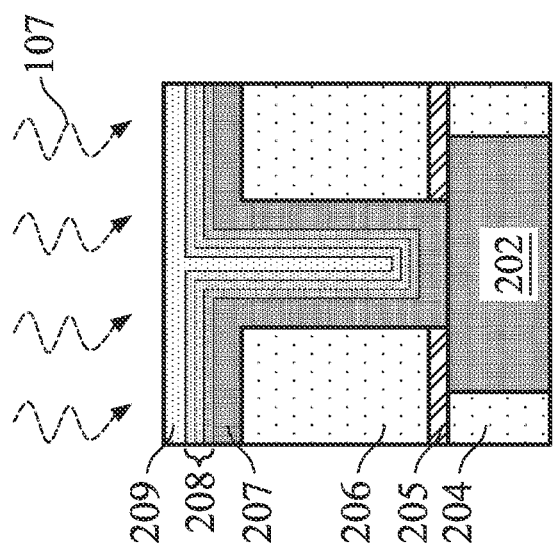
Figure 26E:
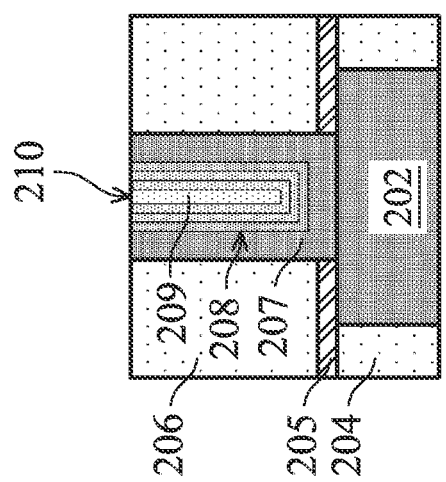
Figure 26F:
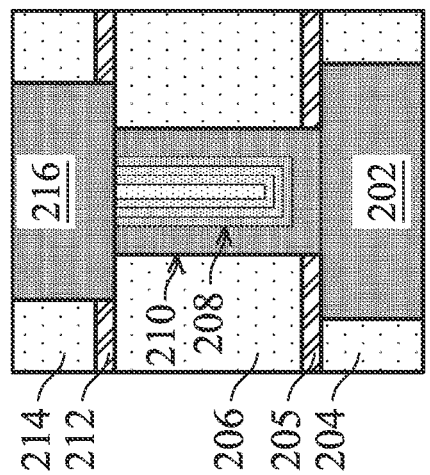

Turning to FIGS. 26A through 26F, intermediate steps in the formation of a conductive feature 210 (see FIGS. 26E-F) are shown, in accordance with some embodiments. The conductive feature 210 may be, for example, a conductive line, a conductive via, or the like. In some embodiments, the conductive feature 210 forms an electrical connection between a lower conductive feature 202 and an upper conductive feature 216, as shown in FIG. 26F. In some embodiments, the conductive feature 210 may be formed as part of a back-end-of-line (BEOL) process or as part of a middle-end-of-line (MEOL) process. In some embodiments, the conductive features 108 shown in FIG. 20B, the conductive features 115A-C shown in FIGS. 24A-B, the conductive features 122A-C shown in FIGS. 25A-B, the conductive features 128A-C shown in FIGS. 25A-B, and/or other conductive features described herein may be similar to the conductive feature 210 and formed using similar techniques. In some embodiments, the conductive feature 210 is formed using techniques similar to those described for the conductive features 108 (see FIGS. 20A-B). In this manner, the advantages described previously for the conductive features 108 may be applicable to a conductive feature 210 formed as part of a BEOL or MEOL process, or the like.

FIG. 26A illustrates an opening 203 that exposes a lower conductive feature 202, in accordance with some embodiments. The structure shown in FIG. 26A includes a lower conductive feature 202 formed in a dielectric layer 204. The lower conductive feature 202 may be formed using any suitable process such as a damascene process, a dual damascene process, or another process. An optional etch stop layer 205 and a dielectric layer 206 are formed over the lower conductive feature 202, and an opening 203 is patterned to expose the lower conductive feature 202. The dielectric layer 204 and/or the dielectric layer 206 may be similar to the second ILD 102 or the dielectric layer 112 described previously, and may be formed using similar techniques. The etch stop layer 205 may be similar to the etch stop layer 110 or the etch stop layer 118 described previously, and may be formed using similar techniques. The opening 203 may be patterned using techniques similar to those described for the openings 103 (see FIG. 16B) or the openings 113A-C(see FIGS. 22A-B). The lower conductive feature 202 may be a conductive line, a conductive via, or the like, and may be similar to conductive features 108, 114A-C, 115A-C, 122A-C, 128A-C, or other conductive features described herein, and may be formed using similar techniques. For example, the lower conductive feature 202 may comprise a single conductive material similar to the conductive features 114A-C or multiple conductive materials similar to the conductive features 115A-C.

In FIG. 26B, a first conductive material 207 is deposited in the opening 203 and on the lower conductive feature 202, in accordance with some embodiments. The first conductive material 207 may be conformally deposited on sidewalls of the opening 203 and on the exposed surface of the lower conductive feature 202. The first conductive material 207 may be similar to the first conductive material 104 (see FIG. 17A-B) or the first conductive material 116 (see FIGS. 24A-B), and may be formed using similar techniques. The first conductive material 207 and the lower conductive feature 202 may be the same material, in some embodiments. In other embodiments, the first conductive material 207 is a different material than the lower conductive feature 202.

In FIG. 26C, a second conductive material 209 is deposited in the opening 203 and over the first conductive material 207, in accordance with some embodiments. The second conductive material 209 may fill the opening 203. The second conductive material 209 may be similar to the second conductive material 106 (see FIG. 18A-B) or the first conductive material 118 (see FIGS. 24A-B), and may be formed using similar techniques. The second conductive material 209 and the lower conductive feature 202 may be the same material, in some embodiments. In other embodiments, the second conductive material 209 is a different material than the lower conductive feature 202.

In FIG. 26D, a thermal process 107 is performed, forming an intermixing interface 208, in accordance with some embodiments. The thermal process 107 may be similar to the thermal process 107 described previously (see FIGS. 19A-B). The intermixing interface 208 is a mixture of the first conductive material 207 and the second conductive material 209, and may be similar to the intermixing interface 105 described previously (see FIGS. 19A-B). In FIG. 26E, a planarization process (e.g., grinding, CMP, or the like) is performed to remove excess first conductive material 207 and second conductive material 209, forming the conductive feature 210. After performing the planarization process, the dielectric layer 206 and the conductive feature 210 may have substantially level surfaces. FIGS. 26E-F show the conductive feature 210 as having substantially vertical sidewalls, but the conductive feature 210 may have sloped sidewalls, curved sidewalls, or another sidewall profile in other embodiments, examples of which are described below for FIGS. 29A-D.

In FIG. 26F, an upper conductive feature 216 is formed on the conductive feature 210, in accordance with some embodiments. The upper conductive feature 216 may be a conductive line, a conductive via, or the like. The upper conductive feature 216 may be formed using any suitable process such as a damascene process, a dual damascene process, or another process. In some embodiments, the upper conductive feature 216 may be similar to the lower conductive feature 202 or other conductive features described herein, and may be formed using similar techniques. For example, the upper conductive feature 216 may comprise a single conductive material similar to the conductive features 114A-C or multiple conductive materials similar to the conductive features 115A-C.

As an example of forming the upper conductive feature 216, an optional etch stop layer 212 and a dielectric layer 214 may be formed over the conductive feature 210 and the dielectric layer 206. An opening may be patterned to expose the conductive feature 210, and conductive material may be deposited in the opening to form the upper conductive feature 216. The dielectric layer 214 may be similar to the dielectric layer 206 described previously, and may be formed using similar techniques. The etch stop layer 212 may be similar to the etch stop layer 205 described previously, and may be formed using similar techniques. The conductive material of the upper conductive feature 216 may be the same as or different from the conductive material of the lower conductive feature 202. In some embodiments, the conductive material of the upper conductive feature 216 comprises the first conductive material 207 and/or the second conductive material 209.

Figure 27C:
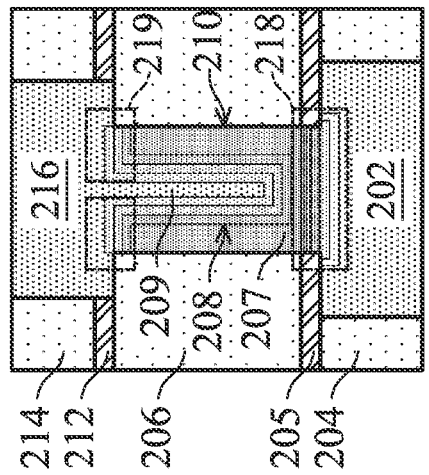
FIGS. 27A, 27B, and 27C are cross-sectional views of conductive features, in accordance with some embodiments.
Figure 27B:
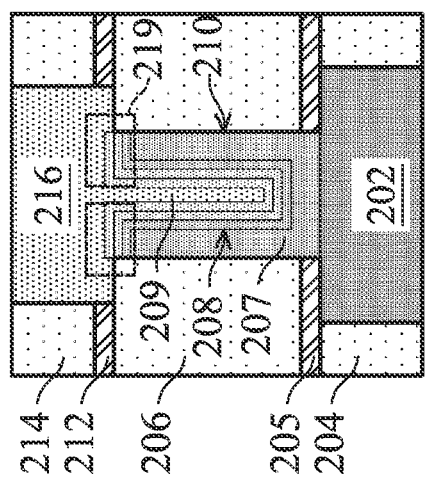
Figure 27A:
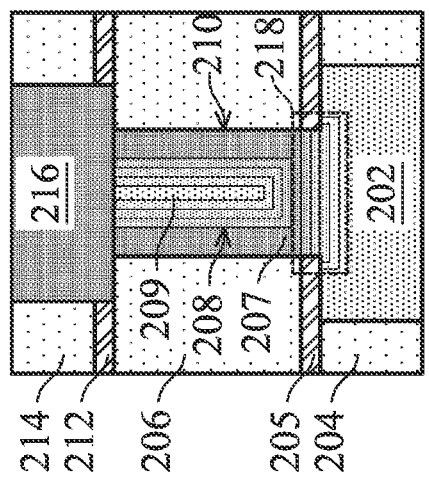

In some embodiments, a thermal process may be performed to form intermixing interfaces between the conductive feature 210 and other conductive features. For example, FIGS. 27A, 27B, and 27C illustrate intermediate steps in the formation of an intermixing interface 218 between the conductive feature 210 and the lower conductive feature 202 the formation of an intermixing interface 219 between the conductive feature 210 and the upper conductive feature 216. FIG. 27A illustrates a lower intermixing interface 218 formed between the conductive feature 210 and the lower conductive feature 202, FIG. 27B illustrates an upper intermixing interface 219 between the conductive feature 210 and the upper conductive feature 216, and FIG. 27C illustrates the formation of both a lower intermixing interface 218 and an upper intermixing interface 219, in accordance with some embodiments. The techniques described for FIGS. 27A-C may be applied to other conductive features or structures described herein. By forming an intermixing interface between the conductive feature 210 and another conductive feature, the resistance between the conductive feature 210 and that other conductive feature may be reduced, which can improve device performance.

FIG. 27A illustrates a structure similar to the structure shown in FIG. 26F, except that a lower intermixing interface 218 has been formed between the conductive feature 210 and the lower conductive feature 202. The material of the lower conductive feature 202 may be chosen such that a homogeneous mixture may be formed with the first conductive material 207. For example, in some embodiments, the material of the lower conductive feature 202 may be the same as the second conductive material 209. In other embodiments, the material of the lower conductive feature 202 may be different than the second conductive material 209. A thermal process similar to the thermal process 107 (see FIGS. 19A-B) may be performed to form the lower intermixing interface 218. In some embodiments, the thermal process may be performed after deposition of the first conductive material 207 to form the lower intermixing interface 218 and then a separate thermal process (e.g., thermal process 107) may be subsequently performed to form the intermixing interface 208 after deposition of the second conductive material 209. In other embodiments, the thermal process may be performed after deposition of the second conductive material 209 to form both the lower intermixing interface 218 and the intermixing interface 208.

FIG. 27B illustrates a structure similar to the structure shown in FIG. 26F, except that an upper intermixing interface 219 has been formed between the conductive feature 210 and the upper conductive feature 216. The material of the upper conductive feature 216 may be chosen such that a homogeneous mixture may be formed with the first conductive material 207. For example, in some embodiments, the material of the upper conductive feature 216 may be the same as the second conductive material 209. In other embodiments, the material of the upper conductive feature 216 may be different than the second conductive material 209. A thermal process similar to the thermal process 107 (see FIGS. 19A-B) may be performed to form the upper intermixing interface 219. In some embodiments, a first thermal process (e.g., thermal process 107) may be performed to form the intermixing interface 208 before formation of the upper conductive feature 216, and then a second thermal process may be performed to form the upper intermixing interface 219 after formation of the upper conductive feature 216. In other embodiments, the upper intermixing interface 219 and the intermixing interface 208 may both be formed using a single thermal process after formation of the upper conductive feature 216.

FIG. 27C illustrates a structure similar to the structure shown in FIG. 26F, except that both a lower intermixing interface 218 and an upper intermixing interface 219 have been formed. The materials of the lower conductive feature 202 and the upper conductive feature 216 may be chosen such that a homogeneous mixture may be formed with the first conductive material 207. For example, in some embodiments, the material of the lower conductive feature 202 and/or the upper conductive feature 216 may be the same as the second conductive material 209. In other embodiments, one or more of the materials of the lower conductive feature 202, the upper conductive feature 216, or the second conductive material 209 may be different. One or more thermal processes similar to the thermal process 107 (see FIGS. 19A-B) may be performed to form the lower intermixing interface 218 and the upper intermixing interface 219. For example, in some embodiments, a first thermal process may be performed to form the lower intermixing interface 218, then a second thermal process (e.g., thermal process 107) may be subsequently performed to form the intermixing interface 208, and then a third thermal process may be subsequently performed to form the upper intermixing interface 219. In other embodiments, a first thermal process may be performed to form both the lower intermixing interface 218 and the intermixing interface 208, and then a second thermal process may be subsequently performed to form the upper intermixing interface 219. In other embodiments, a first thermal process may be performed to form the lower intermixing interface 218, and then a second thermal process may be subsequently performed to form both the intermixing interface 208 and the upper intermixing interface 219. In other embodiments, the lower intermixing interface 218, the intermixing interface 208, and the upper intermixing interface 219 may be formed using a single thermal process after formation of the upper conductive feature 216.

FIGS. 28A through 28D illustrate intermediate steps in the formation of a conductive feature 210 with a capping layer 220, in accordance with some embodiments. The structures shown in FIGS. 28A-D are similar to the structures shown in FIG. 26E-F, except for the formation of the capping layer 220 and the performing of an optional thermal process 227. The capping layer 220 is a conductive material that may effectively increase the contact area between the conductive feature 210 and the upper conductive feature 216, which can reduce contact resistance between the conductive feature 210 and the upper conductive feature 216. Additionally, by performing an optional thermal process 227, an intermixing interface 221 may be formed between the capping layer 220 and the upper conductive feature 216, which can further reduce contact resistance. The techniques described for forming a capping layer shown in FIGS. 28A-D may be applied to other conductive features or structures described herein.

FIG. 28A illustrates a conductive feature 210, in accordance with some embodiments. The structure shown in FIG. 28A is similar to the structure shown in FIG. 26E, and may be formed in a similar manner. In FIG. 28B, a capping layer 220 is formed over the conductive feature 210, in accordance with some embodiments. The material of the capping layer 220 may be chosen such that a homogeneous mixture may be formed with the first conductive material 207 of the conductive feature 207. For example, in some embodiments, the material of the capping layer 220 may be the same as the second conductive material 209. In other embodiments, the material of the capping layer 220 may be different than the second conductive material 209. The capping layer 220 may be formed having a thickness in the range of about 5 Å to about 100 Å, though other thicknesses are possible. The capping layer 220 may have a width that is less than the width of the conductive feature 210, about the same as the width of the conductive feature 210, or greater than the width of the conductive feature 210. For example, the capping layer 220 may have a width that is in the range of about 50% and about 95% of the width of the underlying conductive feature 210. Other widths are possible.

The capping layer 220 may be formed using suitable photolithography and deposition processes. For example, in some embodiments, a photoresist may be formed over the dielectric layer 206 and the conductive feature 210. An opening may then be patterned in the photoresist corresponding to the capping layer 220. The material of the capping layer 220 may then be deposited in the opening and on the conductive feature 210. The material of the capping layer 220 may be deposited using a suitable technique, such as those described previously for the first conductive material 104 (see FIG. 17A-B) or the second conductive material 106 (see FIGS. 18A-B). After depositing the material of the capping layer 220, the photoresist and excess material may be removed using, for example, a suitable etching and/or ashing process. This is an example process for forming the capping layer 220, and other processes are considered within the scope of the present disclosure.

In FIG. 28C, the upper conductive feature 216 is formed over the capping layer 220, in accordance with some embodiments. The upper conductive feature 216 may be similar to the upper conductive feature 216 shown in FIG. 26F, and may be formed in a similar manner. The upper conductive feature 216 may surround and cover the capping layer 220, in some embodiments. The material of the upper conductive feature 216 may be chosen such that a homogeneous mixture may be formed with the material of the capping layer 220. For example, in some embodiments, the material of the upper conductive feature 216 may be the same as the first conductive material 207. In other embodiments, the material of the upper conductive feature 216 may be different than the first conductive material 207. In this manner, the upper conductive feature 216 may make electrical contact to the conductive feature 210 at least partially through the capping layer 220, which can reduce resistance.

In FIG. 28D, an optional thermal process 227 may be performed, forming an intermixing interface 221 around the capping layer 220, in accordance with some embodiments. The thermal process 227 may comprise an anneal or the like, and may be similar to the thermal process 107 described previously (see FIGS. 19A-B), in some embodiments. The thermal process 227 may form an intermixing interface 221 between the capping layer 220 and the upper conductive feature 216. In some embodiments, the thermal process 227 also forms the intermixing interface 221 between the capping layer 220 and the first conductive material 207. In some embodiments, the thermal process 227 is a separate thermal process than the thermal process 107. In other embodiments, the thermal process 107 is not previously performed, and the thermal process 227 forms both the intermixing interface 208 and the intermixing interface 221. By forming an intermixing interface 221 in this manner, the resistance between the upper conductive feature 216 and the capping layer 220 may be reduced, which can further reduce the resistance between the conductive feature 210 and the upper conductive feature 216.

FIGS. 26A through 28D show the conductive feature 210 as having substantially vertical sidewalls, but the conductive feature 210 may have sloped sidewalls, curved sidewalls, or another sidewall profile in other embodiments. As examples, FIGS. 29A, 29B, 29C, and 29D illustrate embodiments in which the conductive feature 210 has different sidewall profiles. The conductive features 210 shown in FIGS. 29A-D may be similar to the conductive features 210 described for FIGS. 26A through 28D, and may be formed using similar techniques. The sidewall profile of the conductive feature 210 may be controlled, for example, by controlling the one or more etching processes that form the opening 203 (see FIG. 26A). The sidewall profiles shown in FIGS. 29A-D are examples, and other sidewall profiles are possible and considered within the scope of the present disclosure.

FIGS. 29A and 29B illustrate conductive features 210 having a sloped or tapered sidewall profile, in accordance with some embodiments. For example, the conductive features 210 may have an upper width that is greater than a lower width. FIG. 29A illustrates a conductive feature 210 without a capping layer 220, similar to the conductive features shown in FIG. 26F or 27A-C. FIG. 29B illustrates a conductive feature 210 with a capping layer 220, similar to the conductive features 210 and capping layers 220 shown in FIGS. 28C-D. In some cases, a conductive feature 210 having sloped sidewalls can have reduced contact resistance between the conductive feature 210 and an overlying upper conductive feature 216.

FIGS. 29C and 29D illustrate conductive features 210 having upper sidewall regions that are rounded or sloped, in accordance with some embodiments. For example, upper sidewall regions of the conductive features 210 may have a width that is greater than a width of lower sidewall regions. FIG. 29C illustrates a conductive feature 210 without a capping layer 220, similar to the conductive features shown in FIG. 26F or 27A-C. FIG. 29D illustrates a conductive feature 210 with a capping layer 220, similar to the conductive features 210 and capping layers 220 shown in FIGS. 28C-D. In some cases, a conductive feature 210 having upper sidewall regions that are wider can have reduced contact resistance between the conductive feature 210 and an overlying upper conductive feature 216.

The disclosed FinFET embodiments could also be applied to nanostructure devices such as nanostructure (e.g., nanosheet, nanowire, gate-all-around, or the like) field effect transistors (NSFETs). In an NSFET embodiment, the fins are replaced by nanostructures formed by patterning a stack of alternating layers of channel layers and sacrificial layers. Dummy gate stacks and source/drain regions are formed in a manner similar to the above-described embodiments. After the dummy gate stacks are removed, the sacrificial layers can be partially or fully removed in channel regions. The replacement gate structures are formed in a manner similar to the above-described embodiments, the replacement gate structures may partially or completely fill openings left by removing the sacrificial layers, and the replacement gate structures may partially or completely surround the channel layers in the channel regions of the NSFET devices. ILDs and contacts to the replacement gate structures and the source/drain regions may be formed in a manner similar to the above-described embodiments. A nanostructure device can be formed as disclosed in U.S. Patent Application Publication No. 2016/0365414, which is incorporated herein by reference in its entirety.

Embodiments of the present disclosure can achieve advantages. In some embodiments, a conductive feature such as a conductive via or conductive line may be formed using a second conductive material deposited on a first conductive material. In some cases, the first conductive material may have a relatively small resistance which can reduce the overall resistance of the conductive feature. One or both of the conductive materials may have a relatively small mean free path, which can reduce resistance of smaller conductive features. In some cases, by using second conductive material in addition to the first conductive material, problematic characteristics of the first conductive material can be lessened. For example, effects such as stress due to thermal expansion or bending due to seam merging can be reduced or eliminated. In some cases, the first conductive material can act as a "liner" and improve adhesion of the second conductive material.

In some embodiments, the first conductive material and the second conductive material of the conductive feature may be chosen such that a homogeneous mixture may be formed between the two conductive materials. A thermal process such as an anneal may be performed to diffuse the first conductive material and the second conductive material and form an intermixing interface having a homogeneous phase. In some cases, forming an intermixing interface in this manner can reduce resistance between the first conductive material and the second conductive material and also improve adhesion between the first conductive material and the second conductive material. In some embodiments, a capping layer may be formed over the conductive feature to increase contact area and reduce contact resistance to an overlying feature. The embodiments described herein may also be applied to various features formed during MEOL and/or BEOL processes, such as contact plugs, conductive lines, and/or conductive vias.

In accordance with an embodiment, a method includes forming a device region over a substrate; forming a first dielectric layer over the device region; forming an opening in the first dielectric layer; conformally depositing a first conductive material along sidewalls and bottom surfaces of the opening; depositing a second conductive material on the first conductive material to fill the opening, wherein the second conductive material is different from the first conductive material; and performing a first thermal process to form an interface region extending from a first region of the first conductive material to a second region of the second conductive material, wherein the interface region includes a homogeneous mixture of the first conductive material and the second conductive material. In an embodiment, the first conductive material is Ru and the second conductive material is Co. In an embodiment, the first thermal process diffuses the first conductive material into the second conductive material. In an embodiment, the first thermal process diffuses the second conductive material into the first conductive material. In an embodiment, the first thermal process includes an anneal performed at a temperature in the range of 100° C. to 1000° C. In an embodiment, the method includes performing a planarization process to remove excess first conductive material and excess second conductive material; after performing the planarization process, depositing a capping layer over the second conductive material, wherein the capping layer comprises the second conductive material; and forming a first conductive feature covering the capping layer. In an embodiment, the method includes performing a second thermal process to diffuse the capping layer into the first conductive feature. In an embodiment, the opening in the first dielectric layer exposes a surface of a second conductive feature, and the first thermal process diffuses the first conductive material into the second conductive feature.

In accordance with an embodiment, a method includes forming a fin protruding from a substrate; forming a gate structure extending along a sidewall and over a top surface of the fin; forming a source/drain region in the fin adjacent the gate structure; forming a first dielectric layer over the source/drain region; forming an opening in the first dielectric layer, wherein the opening exposes a surface of the source/drain region; depositing a liner layer along sidewalls of the opening and on the exposed surface of the source/drain region, the liner layer including a first material; depositing a filler layer on the liner layer, wherein the filler layer includes a second material different from the first material, wherein an interface between the liner layer and the filler layer has a step concentration profile; and performing an annealing process, wherein after performing the annealing process, the interface between the liner layer and the filler layer has a gradient concentration profile. In an embodiment, before performing the annealing process, a first region of the liner layer is free of the second material and a second region of the filler layer is free of the first material, and after performing the annealing process the first region and the second region include mixtures of the first material and the second material. In an embodiment, the annealing process reduces a contact resistance between the liner layer and the filler layer. In an embodiment, the first material includes Ru and the second material includes Co. In an embodiment, the method includes forming a conductive feature over the liner layer and the filler layer, wherein forming the conductive feature includes depositing a layer of the first material on the filler layer. In an embodiment, forming the conductive feature further includes depositing a layer of the second material on the layer of the first material. In an embodiment, the conductive feature makes physical and electrical contact to the gate structure. In an embodiment, the method includes depositing a second dielectric layer over the first dielectric layer, wherein the opening extends through the second dielectric layer.

In accordance with an embodiment, a device includes a first conductive feature extending through a dielectric layer to physically and electrically contact a second conductive feature, wherein the first conductive feature includes an outer layer including a first conductive material; an inner layer including a second conductive material that is different from the first conductive material, wherein the outer layer at least partially surrounds the inner layer; and an interface layer between the outer layer and the inner layer including a homogeneous mixture of the first conductive material and the second conductive material, wherein regions of the interface layer adjacent the outer layer have a greater concentration of the first conductive material than regions of the interface layer adjacent the inner layer. In an embodiment, the second conductive feature includes the second conductive material. In an embodiment, the device includes a third conductive feature physically and electrically contacting a top surface of the first conductive feature, wherein the third conductive feature includes a layer of the second conductive material. In an embodiment, the third conductive feature includes a layer of the first conductive material on the layer of the second conductive material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a device region over a substrate;
   forming a first dielectric layer over the device region;
   forming an opening in the first dielectric layer;
   conformally depositing a first conductive material along sidewalls and bottom surfaces of the opening;
   depositing a second conductive material on the first conductive material to completely fill the opening, wherein the second conductive material is different from the first conductive material;
   performing a first thermal process to form an interface region extending from a first region of the first conductive material to a second region of the second conductive material, wherein the interface region comprises a homogenous mixture of the first conductive material and the second conductive material;
   performing a planarization process to remove excess first conductive material and excess second conductive material;
   after performing the planarization process, depositing a capping layer over the second conductive material, wherein the capping layer comprises the second conductive material;
   forming a first conductive feature covering the capping layer; and
   after forming the first conductive feature, performing a second thermal process to diffuse the capping layer into the first conductive feature.

2. The method of claim 1, wherein the first conductive material is Ru and the second conductive material is Co.

3. The method of claim 1, wherein the first thermal process diffuses the first conductive material into the second conductive material.

4. The method of claim 1, wherein the first thermal process comprises an anneal performed at a temperature in the range of 100° C. to 1000° C.

5. The method of claim 1, wherein the opening in the first dielectric layer exposes a surface of a second conductive feature, and wherein the first thermal process diffuses the first conductive material into the second conductive feature.

6. A method comprising:
   forming a first dielectric layer over a first conductive feature;
   forming an opening in the first dielectric layer, wherein the opening exposes a surface of the first conductive feature;
   depositing a liner layer along sidewalls of the opening and on the exposed surface of the first conductive feature, the liner layer comprising a first material;
   depositing a filler layer on the liner layer, wherein the filler layer comprises a second material different from the first material, wherein an interface between the liner layer and the filler layer has a step concentration profile, wherein the filler layer fills the opening;
   performing a first annealing process, wherein after performing the first annealing process, the interface between the liner layer and the filler layer comprises a homogenous mixture of the first material and the second material; and
   forming a second conductive feature over the liner layer and the filler layer, wherein the second conductive feature extends on a top surface of the first dielectric layer, wherein the second conductive feature comprises a layer of the second material.

7. The method of claim 6 further comprising performing a second annealing process, wherein after performing the second annealing process, an interface between the second conductive feature and the liner layer comprises a homogenous mixture of the first material and the second material.

8. The method of claim 6, wherein a width of the second conductive feature is greater than a width of the opening.

9. The method of claim 6, wherein the second material is cobalt.

10. The method of claim 6, wherein after performing the first annealing process, an interface between the liner layer and the first conductive feature comprises a homogenous mixture of the first material and the second material.

11. The method of claim 6, wherein forming the second conductive feature comprises depositing a layer of the first material on the layer of the second material.

12. The method of claim 6 further comprising depositing a second dielectric layer over the first dielectric layer, wherein the opening extends through the second dielectric layer.

13. A method comprising:
forming an opening in an insulating layer;
depositing a first metal to form a first metal region, wherein the first metal region extends on a bottom surface of the opening and sidewalls of the opening, wherein top surfaces of the first metal region and the insulating layer are level;
depositing a second metal on the first metal region to form a second metal region, wherein the second metal is different than the first metal, wherein a top surface of the second metal region is higher than the top surface of the insulating layer;
depositing the first metal over the second metal region; and
performing an anneal process to form a third metal region over the second metal region, wherein the third metal region comprises a mixture of the first metal and the second metal.

14. The method of claim 13, wherein after performing the anneal process, the top surface of the first metal region is lower than the top surface of the insulating layer.

15. The method of claim 13, wherein the top surface of the insulating layer is free of the second metal region.

16. The method of claim 13, wherein a width of the third metal region is greater than a width of the first metal region.

17. The method of claim 1, wherein the second thermal process further diffuses the capping layer into the first conductive material.

18. The method of claim 1, wherein the capping layer is a layer of the second conductive material.

19. The method of claim 1, wherein the first conductive feature is free of the second conductive material.

20. The method of claim 13, wherein the third metal region physically contacts the insulating layer.

* * * * *